United States Patent
So et al.

(10) Patent No.: US 9,123,667 B2
(45) Date of Patent: Sep. 1, 2015

(54) POWER-EFFICIENT RGBW OLED DISPLAY

(75) Inventors: Woo-Young So, Richboro, PA (US); Michael Weaver, Princeton, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 460 days.

(21) Appl. No.: 13/252,491

(22) Filed: Oct. 4, 2011

(65) Prior Publication Data
US 2013/0082589 A1   Apr. 4, 2013

(51) Int. Cl.
H01L 27/32       (2006.01)
H01L 51/54       (2006.01)
H01L 51/50       (2006.01)

(52) U.S. Cl.
CPC .......... H01L 27/3213 (2013.01); H01L 27/322 (2013.01); H01L 51/5036 (2013.01)

(58) Field of Classification Search
CPC .............. H01L 27/322; H01L 51/5036; H01L 27/3213
USPC ................................................ 313/504, 506
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,117,529 A * | 9/2000 | Leising et al. ................ 428/209 |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,844,670 B2 | 1/2005 | Kuma et al. |
| 7,279,704 B2 | 10/2007 | Walters et al. |
| 7,431,968 B1 | 10/2008 | Shtein et al. |
| 7,453,200 B2 * | 11/2008 | Jou et al. ........................ 313/504 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Karabi Guharay
(74) *Attorney, Agent, or Firm* — Morris & Kamlay LLP

(57) ABSTRACT

Embodiments described herein may provide for devices comprising a power efficient RGBW display. In some embodiments, a first device may be provided. The first device may include at least one pixel. The pixel may include a first sub-pixel, a second sub-pixel, a third sub-pixel, and a fourth sub-pixel. The first sub-pixel may include a first color filter in optical communication with a first organic light emitting device. The second sub-pixel may include a second color filter in optical communication with a second organic light emitting device. The third sub-pixel may include a third color filter in optical communication with a third organic light emitting device. The fourth sub-pixel may include a fourth organic light emitting device and emits near white light. At least one of the first sub-pixel or the second sub-pixel may include a color conversion layer in optical communication with the first or second organic light emitting device.

12 Claims, 15 Drawing Sheets

(56) References Cited

U.S. PATENT DOCUMENTS

| | | |
|---|---|---|
| 2003/0230980 A1 | 12/2003 | Forrest et al. |
| 2004/0174116 A1 | 9/2004 | Lu et al. |
| 2005/0093435 A1* | 5/2005 | Suh et al. ............... 313/504 |
| 2006/0105198 A1 | 5/2006 | Spindler et al. |
| 2010/0013748 A1 | 1/2010 | Cok et al. |

OTHER PUBLICATIONS

Baldo et al., "Very high-efficiency green organic light-emitting devices based on electrophosphorescence," Appl. Phys. Lett., vol. 75, No. 3, 4-6 (1999).

J.P. Spindler, et al., "System Considerations for RGBW OLED Displays;" Journal of the Society for Information Display, vol. 14.1; p. 37 (2006).

J.P. Spindler, et al., "Lifetime-and Power-Enhanced RGBW Displays Based on White OLEDs;" Journal of the Society for Information Display; p. 36 (2005).

S.A. Van Slyke, "Advanced Active Matrix OLED Technologies," Display and Components OLED Modules Business Unit, Eastman Kodak Company Rochester, New York, USA, Intertech (2004).

Hack et al. "Invited Paper: High Efficiency Phosphorescent AMOLEDs: The Path to Long Lifetime TVs," Journal of the Society for Information Display, vol. 42.1 (May 15, 2011).

A. D. Arnold, et al., Full-color AMOLED with RGB Pixel Pattern, Journal of the Society for Information Display 13, 525-535 (2005).

U.S. Appl. No. 13/185,063, filed Jul. 18, 2011.

* cited by examiner

POWER-EFFICIENT RGBW OLED DISPLAY

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris (2-phenylpyridine) iridium, denoted Ir(ppy)$_3$, which has the structure of Formula I:

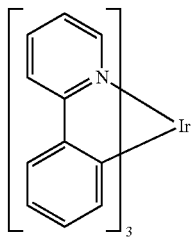

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Embodiments described herein may provide for devices comprising a power efficient RGBW display. In some embodiments, a first device may be provided. The first device may include at least one pixel. The pixel may include a first sub-pixel, a second sub-pixel, a third sub-pixel, and a fourth sub-pixel. The first sub-pixel may include a first organic light emitting device and a first color filter in optical communication with the first organic light emitting device, where the first color filter may be adapted to preferentially pass light from the first organic light emitting device having a peak wavelength in the visible spectrum between 580 and 700 nm. The second sub-pixel may include a second organic light emitting device and a second color filter in optical communication with the second organic light emitting device, where the second color filter may be adapted to preferentially pass light from the second organic light emitting device having a peak wavelength in the visible spectrum between 500 and 580 nm. The third sub-pixel may include a third organic light emitting device and a third color filter in optical communication with the third organic light emitting device, where the third color filter may be adapted to preferentially pass light from the third organic light emitting device having a peak wavelength in the visible spectrum between 400 and 500 nm. The fourth sub-pixel may include a fourth organic light emitting device and may emit near white light. At least one of the first sub-pixel or the second sub-pixel may include a color conversion layer in optical communication with either the first or the second organic light emitting device. At least one color conversion layer may be disposed between the first or the second organic light emitting device and either the first or the second color filter.

In some embodiments, in the first device as described above comprising a first pixel, where the first pixel includes a first sub-pixel having a first organic light emitting device and first color filter, a second sub-pixel having a second organic light emitting device and a second color filter, a third sub-pixel having a third organic light emitting device and a third color filter, and a fourth sub-pixel having a fourth organic light emitting device and emits near white light, the first sub-pixel may include a first color conversion layer that may be in optical communication with the first organic light emitting device and may be disposed between the first organic light emitting device and the first color filter. The first color conversion layer may include a material having an absorption spectrum having a peak wavelength that is less than 600 nm and an emission spectrum having a peak wavelength between 580 and 700 nm. In some embodiments, the second sub-pixel may include a second color conversion layer, where the second color conversion layer may be in optical communication with the second organic light emitting device and may be disposed between the second organic light emitting device and the second color filter. The second color conversion layer may comprise a material having an absorption spectrum having a peak wavelength that is less than 500 nm and an emission spectrum having a peak wavelength that is between 500 and 580 nm.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the first color conversion layer and/or the second conversion layer may have a photoluminescence quantum yield (PLQY) of at least 40%. In some embodiments, the first color conversion layer and/or the second conversion layer may have a PLQY of at least 60%. In some embodiments, the first color conversion layer and the second conversion layer may have a PLQY of at least 80%.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the first color conversion layer may have a thickness that is between approximately 0.1 and 100 microns. In some embodiments, in the first device as described above, the second color conversion layer may have a thickness that is between approximately 0.1 and 100 microns.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the first color conversion layer may have a dye concentration between approximately 0.1% and 40%. In some embodiments, in the first device as described above, the second color conversion layer may have a dye concentration between approximately 0.1% and 40%.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the fourth sub-pixel may not comprise a color filter and/or a color conversion layer.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the chromaticity of the fourth organic light emitting device may be substantially the same as the chromaticity of the light emitted by the fourth sub-pixel.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the first device may be a display having a white balance. In some embodiments, the white balance may have a first point on the CIE 1976 UCS (L', u', v') color space chromaticity diagram and the fourth sub-pixel may emit light having a second point on the CIE 1976 UCS (L', u', v') color space chromaticity diagram. In some embodiments, the difference between the first point and the second point may have a duv value less than 0.10. In some embodiments, the difference between the first point and the second point may have a duv value less than 0.05. In some embodiments, the difference between the first point and the second point may have a duv value less than 0.01.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the first, the second, the third, and the fourth organic light emitting devices may include exactly two organic emitting materials: a first organic emitting material and a second organic emitting material.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting devices each include exactly two emitting materials: a first organic emitting material and a second organic emitting material, the first organic emitting material may have an emissive spectrum having a peak wavelength between 500 and 630 nm. In some embodiments, in the first device as described above, the second organic emitting material may have an emissive spectrum having a peak wavelength between 400 and 500 nm.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting devices each include exactly two emitting materials: a first organic emitting material and a second organic emitting material, the first organic emitting material may have an emissive spectrum having a peak wavelength between 520 and 630 nm. In some embodiments, in the first device as described above, the second organic emitting material may have an emissive spectrum having a peak wavelength between 400 and 500 nm. In some embodiments, the first organic emitting material may have a full width at half maximum (FWHM) of less than 100.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device each include a first organic emitting material having an emissive spectrum having a peak wavelength between 520 and 630 nm and a second organic emitting material having an emissive spectrum having a peak wavelength between 400 and 500, the first color conversion layer may have an absorption spectrum such that at least approximately 10% of the light emitted by the first emitting material is absorbed. In some embodiments, the first color conversion layer may have an absorption spectrum such that at least approximately 30% of the light emitted by the first emitting material is absorbed. In some embodiments, the first color conversion layer may have an absorption spectrum such that at least approximately 50% of the light emitted by the first emitting material is absorbed. In some embodiments, first color conversion layer may have an absorption spectrum such that at least approximately 30% of the light emitted by the second emitting material is absorbed.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device each include a first organic emitting material having an emissive spectrum having a peak wavelength between 520 and 630 nm and a second organic emitting material having an emissive spectrum having a peak wavelength between 400 and 500, the first color conversion layer may have an absorption spectrum such that at least approximately 10% of the light emitted by the first organic light emitting device is absorbed.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device each include a first organic emitting material having an emissive spectrum having a peak wavelength between 520 and 630 nm and a second organic emitting material having an emissive spectrum having a peak wavelength between 400 and 500, the second color conversion layer may have an absorption spectrum such that at least approximately 10% of the light emitted by the second emitting material is absorbed. In some embodiments, the second color conversion layer may have an absorption spectrum such that at least approximately 30% of the light emitted by the second emitting material is absorbed.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device each include a first organic emitting material having an emissive spectrum having a peak wavelength between 520 and 630 nm and a second organic emitting material having an emissive spectrum having a peak wavelength between 400 and 500, the second color conversion layer may have an absorption spectrum such that at least approximately 5% of the light emitted by the second organic light emitting device is absorbed.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, and where the first, the second, the third, and the fourth organic light emitting devices each include exactly two emitting materials: a first organic emitting material and a second organic emitting material, the first organic emitting material may have an emission spectrum such that it emits yellow light that has a first point on the CIE 1931 XYZ color space chromaticity diagram within a first area defined by $CIE_X=0.40$ to 0.600, $CIE_Y=0.400$ to 0.60. The second organic emitting material may have an emissive spectrum such that it emits blue light that has a second point on the CIE 1931 XYZ color space chromaticity diagram within a second area defined by $CIE_X=0.100$ to 0.200, $CIE_Y=0.050$ to 0.300. The first point and the second point may be such that when a line is drawn between the first point and the second point, the line passes through a desired white point on the CIE 1931 XYZ color space chromaticity diagram within an area defined to be $CIE_X=0.25$ to 0.4, $CIE_Y=0.25$ to 0.4. In some embodiments, the concentration of the first and second organic emitting materials may be such that the light produced by the first, the second, the third, and the fourth organic light emitting devices is at a third point on the CIE 1931 XYZ color space chromaticity diagram that is within the defined area.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, and where the first, the second, the third, and the fourth organic light emitting devices each includes exactly two emitting materials: a first organic emitting material and a second organic emitting material, the first and/or the second organic emitting material may comprise a phosphorescent emitter. In some embodiments, the first organic emitting material may comprise a phosphorescent emitter and the second organic emitting material may comprise a fluorescent emitter.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the fourth sub-pixel may emit light that has a first point on the CIE 1931 XYZ color space chromaticity diagram within a first area defined by $CIE_X=0.25$ to 0.4, $CIE_Y=0.25$ to 0.4.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the fourth sub-pixel may emit light that has a first point on the CIE 1976 UCS (L', u', v') color space chromaticity diagram that lies within a Duv distance of 0.010 from the Planckian locus. In some embodiments, the fourth sub-pixel may emit light that has a first point on the CIE 1976 UCS (L', u', v') color space chromaticity diagram that lies within a Duv distance of 0.005 from the Planckian locus. In some embodiments, the fourth sub-pixel may emit light that has a first point on the CIE 1976 UCS (L', u', v') color space chromaticity diagram that lies within a Duv distance of 0.002 from the Planckian locus.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the fourth sub-pixel may emit light that has a correlated color temperature (CCT) that is greater than 4000 K and less than 10000 K. In embodiments, in the first device as described above, the first, the second, the third, and the fourth organic light emitting devices each may comprise a stacked organic light emitting device (SOLED).

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first, the second, the third, and the fourth organic light emitting devices each may include three organic emitting materials: a first organic emitting material, a second organic emitting material, and a third organic emitting material. In some embodiments, the first organic emitting material may have an emission spectrum such that it emits red light that has a first point on the CIE 1931 XYZ color space chromaticity diagram within a first area defined by $CIE_X=0.600$ to 0.720, $CIE_Y=0.280$ to 0.400. In some embodiments, the second organic emitting material may have an emission spectrum such that it emits green light that has a second point on the CIE 1931 XYZ color space chromaticity diagram within a second area defined by $CIE_X$=0.200 to 0.400, $CIE_Y$=0.600 to 0.750. In some embodiments, the third organic emitting material may have an emission spectrum such that it emits blue light that has a third point on the CIE 1931 XYZ color space chromaticity diagram within a third area defined by $CIE_X$=0.100 to 0.200, $CIE_Y$=0.050 to 0.300. In some embodiments, the first, second, and third point described above are such that a fourth area may be defined by a line that is drawn between the first point and the second point, the second point and the third point, and the third point and the first point that includes a desired white point on the CIE 1931 XYZ color space chromaticity diagram within an area defined to be $CIE_X$=0.25 to 0.40, $CIE_Y$=0.25 to 0.40. In some embodiments, a concentration of the first, second, and third organic emitting materials may be such that the light that may be produced by the first organic light emitting device may be at a fourth point on the CIE 1931 XYZ color space chromaticity diagram that is within the defined area.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first, the second, the third, and the fourth organic light emitting devices each may include three organic emitting materials: a first organic emitting material, a second organic emitting material, and a third organic emitting material, the first, second, and/or third organic emitting materials comprise phosphorescent emitters. In some embodiments, the third organic emitting material may comprise fluorescent emitters and the first and second organic emitting materials may comprise phosphorescent emitters.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first, the second, the third, and the fourth organic light emitting devices each may include three organic emitting materials: a first organic emitting material, a second organic emitting material, and a third organic emitting material, the first organic emitting material may have an emission spectrum having a peak wavelength between 580 and 700 nm, the second organic emitting material may have an emission spectrum having a peak wavelength between 500 and 580 nm, and the third organic emitting material may have an emission spectrum having a peak wavelength between 400 and 500 nm.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first, the second, the third, and the fourth organic light emitting devices each may include three organic emitting materials: a first organic emitting material having an emission spectrum having a peak wavelength between 580 and 700 nm, a second organic emitting material having an emission spectrum having a peak wavelength between 500 and 580 nm, and a third organic emitting material having an emission spectrum having a peak wavelength between 400 and 500 nm, the first color conversion layer may have an absorption spectrum such that at least approximately 20% of the light emitted by the second and third emitting materials is absorbed. In some embodiments, in the first device as described above, the first color conversion layer may have an absorption spectrum such that at least approximately 40% of the light emitted by the second and third emitting materials is absorbed. In some embodiments, in the first device as described above, the first color conversion layer may have an absorption spectrum such that at least approximately 10% of the light emitted by the third emitting material is absorbed. In some embodiments, in the first device as described above, the first color conversion layer may have an absorption spectrum such that at least approximately 10% of the light emitted by the second emitting material is absorbed. In some embodiments, in the first device as described above, the first color conversion layer may have an absorption spectrum such that at least approximately 10% of the light emitted by the first organic light emitting device is absorbed.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first, the second, the third, and the fourth organic light emitting devices each may include three organic emitting materials: a first organic emitting material having an emission spectrum having a peak wavelength between 580 and 700 nm, a second organic emitting material having an emission spectrum having a peak wavelength between 500 and 580 nm, and a third organic emitting material having an emission spectrum having a peak wavelength between 400 and 500 nm, the second color conversion layer may have an absorption spectrum such that at least approximately 10% of the light emitted by the third emitting material is absorbed. In some embodiments, in the first device as described above, the second color conversion layer has an absorption spectrum such that at least approximately 30% of the light emitted by the third emitting material is absorbed. In some embodiments, in the first device as described above, the second color conversion layer may have an absorption spectrum such that at least approximately 5% of the light emitted by the second organic light emitting device is absorbed.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, each of the first, second, third, and fourth sub-pixels may have an aperture size, and the aperture size of the fourth sub-pixel may be larger than the aperture size of each of the first, second, and third sub-pixels.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, the first sub-pixel may further include a third color conversion layer, the third color conversion layer may be in optical communication with the first organic light emitting device and may be disposed between the first organic light emitting device and the first color filter. In some embodiments, the third color conversion layer may include a material having an absorption spectrum having a peak wavelength that is less than 500 nm and an emission spectrum having a peak wavelength between 500 and 580 nm. In some embodiments, the third color conversion layer may be disposed between the first organic light emitting device and the first color conversion layer.

In some embodiments, in the first device as described above comprising a first pixel, where the first pixel includes a first sub-pixel having a first organic light emitting device and a first color filter, a second sub-pixel having a second organic light emitting device and a second color filter, a third sub-pixel having a third organic light emitting device and a third color filter, and a fourth sub-pixel having a fourth organic light emitting device and emits near white light, the first sub-pixel may include a first color conversion layer. The first color conversion layer may be in optical communication with the first organic light emitting device and may be disposed between the first organic light emitting device and the first color filter. In some embodiments, the first color conversion layer may comprise a material having an absorption spectrum having a peak wavelength that is less than 600 nm and an emission spectrum with a peak wavelength between 580 and 700 nm.

In some embodiments, in the first device as described above comprising a first pixel, where the first pixel includes a first sub-pixel having a first organic light emitting device, and a first color filter, a second sub-pixel having a second organic light emitting device and a second color filter, a third sub-pixel having a third organic light emitting device and a third color filter, and a fourth sub-pixel having a fourth organic light emitting device and emits near white light, the second sub-pixel may include a color conversion layer. The color conversion layer may be in optical communication with the second organic light emitting device and may be disposed between the second organic light emitting device and the second color filter. The second color conversion layer may comprise a material having an absorption spectrum having a peak wavelength that is less than 500 nm and an emission spectrum with a peak wavelength between 500 and 580 nm.

Embodiments may provide a display design for a power-efficient red, green, blue, white (RGBW) OLED display by, for instance, enhancing the emission of the red and/or green sub-pixels of at least one of the pixels (but preferably a plurality of sub-pixels of one or more of the pixels that comprise the display). In some embodiments, the display may use a RGBW pixel layout, where each pixel may be divided into four sub-pixels. A white OLED may be used for all four sub-pixels. That is, for instance, each sub-pixel may comprise an OLED that shares a common organic layer with the OLEDs of each of the other sub-pixels; however, each OLED may be individually addressable based on, for instance, an individually patterned electrode (or electrodes). The light from each of the individually addressable OLEDs may pass through the corresponding sub-pixel of the pixel (e.g. the light from the OLED corresponding to the first sub-pixel may pass through the first sub-pixel (and preferably not through the other sub-pixels), the light from the OLED corresponding to the second sub-pixel may pass through the second sub-pixel, etc.).

A red color filter may be used with one sub-pixel (R), a green color filter may be used with one sub-pixel (G), and a blue color filter may be used with one sub-pixel (B). The remaining sub-pixel may not use a color filter (although embodiments are not so limited), and may thereby emit white (W) light (or near white light). In some embodiments, the white OLEDs of each sub-pixel may generate white light by mixing (e.g. color adding) blue and yellow components (which may simplify the fabrication processes by utilizing only two organic emitting materials) or red, green, and blue components (i.e. emitting materials). In general, a mismatch between the transmittance of the color filters (i.e. the wavelengths of light that is not absorbed or reflected by the color filter) of the sub-pixels and, for instance, the emission spectrum of the yellow component of the OLEDs (i.e. the yellow emitting material) and/or the blue component (i.e. the blue emitting material) may result in the reduction of the current efficacies of the red and green sub-pixels, which may be a factor in the power consumption of the sub-pixels.

In some embodiments, one or more color conversion layers may be utilized within the sub-pixel to improve the sub-pixel current efficacy of an RGBW OLED display. For instance, the blue emission of a white OLED light source may be used to excite additive green emission (utilizing a down conversion layer) for the green sub-pixel, and yellow emission of the white light may be utilized to generate down-converted red emission in the red sub-pixel. In this manner, the down conversion of the white light may enhance matching between the color filter transmission spectrum and the wavelength of the light emissions entering the corresponding sub-pixel. That is, the light that passes through a sub-pixel and a corresponding color filter will have a greater amount of light having a wavelength that is within the transmission spectrum of the color filter, and therefore less light will be absorbed or reflected by the color filter. Embodiments may thereby improve the power efficiency of display devices by increasing the light that is emitted by each sub-pixel (while reducing the amount of light that is blocked (e.g. reflected or absorbed) by the color filters, and that thereby does not contribute to the display).

BRIEF DESCRIPTION OF THE DRAWINGS

FIG. 5($b$) shows a transmission spectrum for the light that is transmitted through an exemplary green color filter. FIG. 5($c$) shows a transmission spectrum for the light that is transmitted through an exemplary blue color filter.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
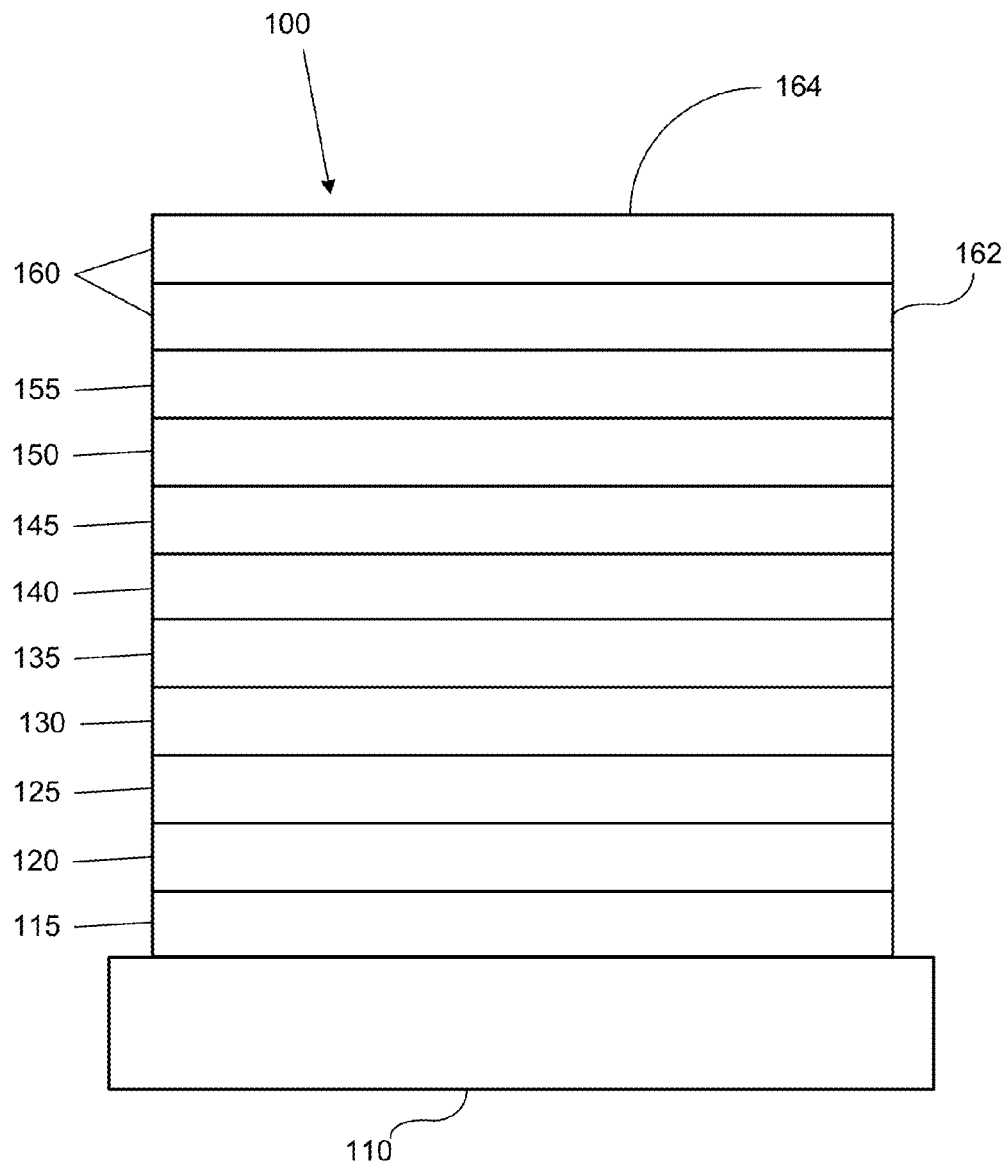
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
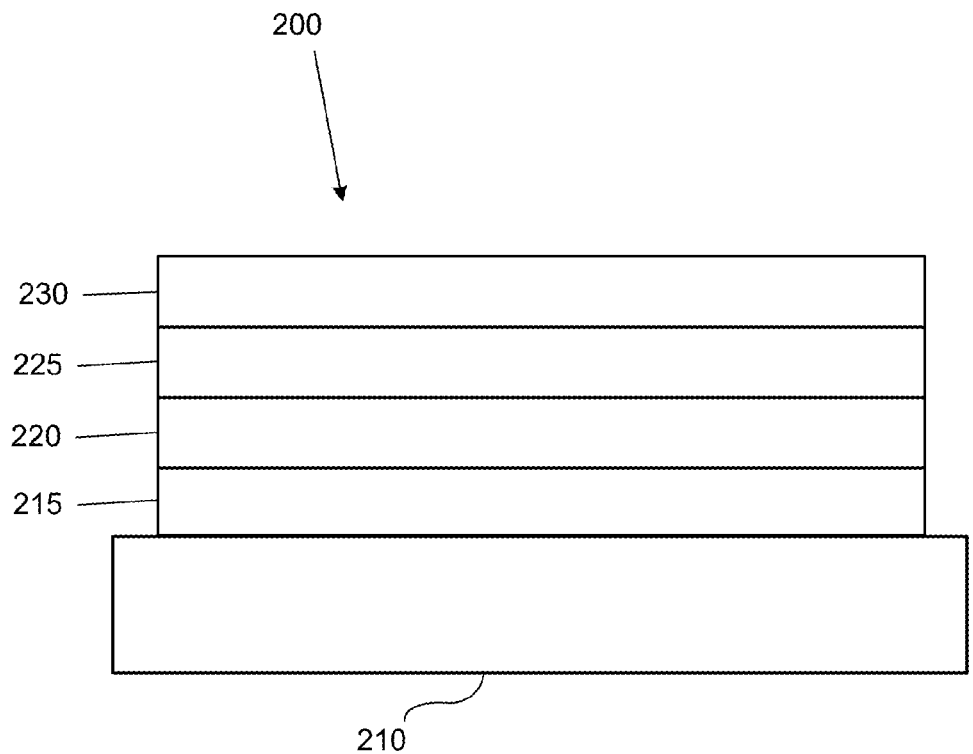
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used.

Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Additional definitions for terms as used in this application are provided as follows:

As used herein, and as would be understood by one of skill in the art, a "color conversion layer" (e.g. a "down conversion layer") may comprise a film of fluorescent or phosphorescent material which efficiently absorbs higher energy photons (e.g. blue light and/or yellow light) and reemits photons at lower energy (e.g. at green and/or red light) depending on the materials used. That is, the color conversion layer may absorb light emitted by an organic light emitting device (e.g. a white OLED) and reemit the light (or segments of the wavelengths of the emission spectrum of the light) at a longer wavelength.

As used herein, and as would be generally understood by one of skill in the art, the term "emitting" as used to describe a material (e.g. "emitting material") in a device refers to a material that emits a significant amount of light when the device is operated under normal conditions. For example, Ir(ppy)$_3$ is a well-known emissive organic material. Ir(ppy)$_3$ may be used as an emitting material in an OLED, generally by including it in the emissive layer with a host, in a device designed such that recombination occurs in or near the layer containing Ir(ppy)$_3$, and such that emission from the Ir(ppy)$_3$ is energetically favored. However, Ir(ppy)$_3$ may also be used in an OLED as a material that is not an "emitting" material. For example, it is known to use Ir(ppy)$_3$ as a hole transport material in a hole transport layer, such that the Ir(ppy)$_3$ functions to transport holes to an emissive layer where a different material emits light. In this context, Ir(ppy)$_3$ is not considered an "emitting" material.

As used herein, the term "commonly addressable" may refer to configurations in which the current in one device (or group of devices) cannot be changed without changing the current in another device (or group of devices). The current and/or voltage supplied to each device or group of devices need not be the same. However, once the current is established for one device or group of devices, this also sets the current for the other groups. That is, "commonly addressable" may refer to configurations in which there is essentially a single switch that controls whether the devices are "on" or "off" (i.e. whether the devices are driven by a current). The devices or groups of devices may not thereby be individually activated and/or deactivated. In this regard, the OLEDs may also be dimmed (e.g. by reducing the current supplied to the device or portions thereof), but in such a case, each of the OLEDs are dimmed together. That is, if one OLED is dimmed, each of the other OLEDs is also dimmed, though not necessarily by the same proportion. This may be in contrast to devices or groups of devices that are individually addressable, where each device may be activated independently of the other devices.

As used herein, a "sub-pixel" may refer to an individually addressable segment or component of a pixel, wherein each segment may emit a different wavelength of visible light that may be combined with other segments within a pixel to provide a desired color in a lighting device (such as a display). A "pixel" is typically the most basic unit of an image displayed on a display (such as computer or television screen), on a printer, or other device. Pixels may be arranged in any manner (for instance, in rows and columns) and a given combination among the pixels of various brightness and color values may form an image. Each sub-pixel may be a component of a pixel used in the representation of a color image. An example of a pixel comprising sub-pixels is shown in FIGS. 3 and 12-14, and described below.

As used herein, "emitting" light by or from a sub-pixel (or other components) may comprise having light pass through a sub-pixel of a device, but does not require that the sub-pixel generate the light in any way. For instance, the light that is "emitted" from a sub-pixel may emanate initially from a first light source (that is, for instance, it may comprise the emissions from a white OLED in an RGBW display), and may pass unimpeded through a sub-pixel, through one or more color filters, through one or more color conversion layers (e.g. down conversion layers), etc. and/or may pass through any number of other optical components, such as a polarizer.

As used herein, "chromaticity" may refer to an objective specification of the quality of a color regardless of its luminance. That is, as determined by its hue and colorfulness (or saturation, chrominance, intensity, or excitation purity). The chromaticity of light emissions may be measured, for instance using the CIE 1931 XYZ color space or the CIE 1976 Uniform Chromaticity Scale (UCS) (L', u', v') color space.

As used herein, "white balance" may refer to the chromaticity coordinates that serve to define the color "white" in image encoding or reproduction. White balance is also often referred to as the "white balance point" or "white point". The white balance designates the color that is produced, emanated, and/or passed through by a device (or component thereof) to represent the color "white". As may be understood by one of ordinary skill in the art, there are many different shades of the color white comprising warmer and cooler colors, and each may comprise a different relative balance of the amount of the input colors (e.g. of red light, blue light, and green light). Thus, the white balance may be a setting that adjusts the relative intensities of the red, green and blue pixels in a display for a given image.

Figure 3:
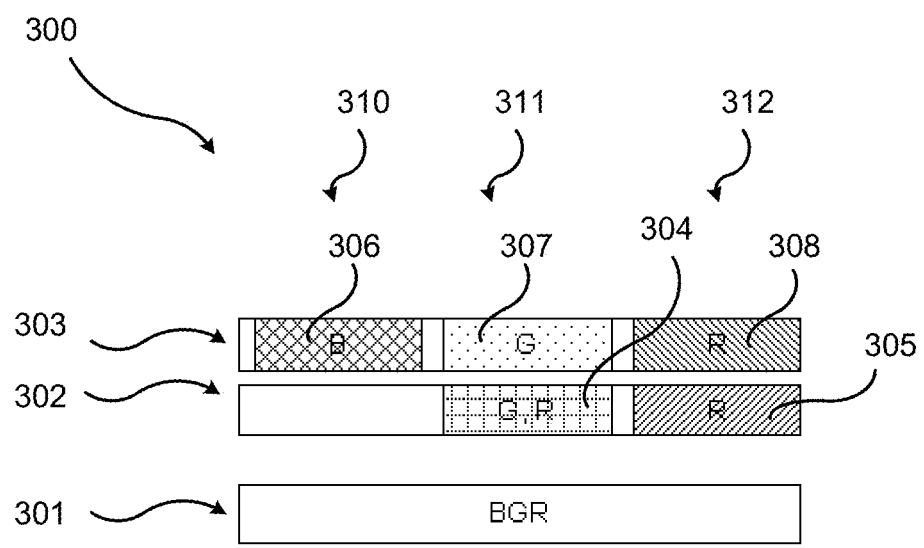
FIG. 3 shows an exemplary pixel of a red, green, blue (RGB) OLED display comprising a plurality of color conversion layers.

As used herein, "optical communication" may refer to components that are configured in such a way that light that emanates from or passes through a first component also passes through or emanates from the second component. For instance, if light is generated by a light source (such as an OLED), and the generated light emission then passes through the aperture of a pixel (or a sub-pixel), then the OLED and the pixel (or sub-pixel) may be said to be in optical communication. Optical communication does not require that all of the light that emanates from or passes through the first component also pass through the second component. An example of an OLED that is in optical communication with four sub-pixels is shown in FIG. 3.

As used herein, "duv" is a general term that may be used to quantify the difference in chromaticity between different lighting devices (such as OLED displays or components of OLED displays). This can quantified in terms of $duv=\sqrt{(\Delta u'^2+\Delta v'^2)}$, where (u', v') are the coordinates of the different lighting devices in the CIE 1976 UCS (L', u', v') color space chromaticity diagram. The CIE 1976 UCS (L', u', v') color space is used in preference over the CIE 1931 XYZ color space because in the CIE 1976 UCS (L', u', v') color space chromaticity diagram, distance is approximately proportional to perceived difference in color. An alternative name for the CIE 1976 UCS (uniform chromaticity scale) diagram is the CIE 1976 (L*, u*, v*) color space chromaticity diagram. The conversion between coordinates in these color spaces is very simple: u'=4x/(−2x+12y+3) and v'=9y/(−2x+12y+3), where (x, y) are the coordinates of the CIE 1931 XYZ color space chromaticity diagram.

The term "Duv" is a specific example of "duv." In this regard, Duv refers to the minimum distance in the CIE 1976 UCS (L', u', v') color space chromaticity diagram of the lighting device chromaticity from the blackbody curve. That is, Duv is a measure of the difference in chromaticity between a lighting device and a blackbody radiator of equivalent correlated color temperature. This can be quantified in terms of $Duv=\sqrt{(\Delta u'^2+\Delta v'^2)}=\sqrt{((u1'-u2')^2+(v1'-v2')^2)}$, where (u1', v1') are the coordinates of the lighting device, and (u2', v2') are the coordinates of the blackbody curve at the minimum distance from the lighting device in the CIE 1976 UCS (L', u', v') color space chromaticity diagram.

As used herein, "D65," may refer to light having a correlated color temperature (CCT) of 6504 K. D65 originally described light having a CCT of 6500 K, but due to a correction of the constants in Planck's law, the CCT was later modified to a slightly higher CCT of 6504 K. The chromaticity coordinates of D65 in CIE 1931 XYZ color space chromaticity diagram are CIE 1931 (x, y)=(0.313, 0.329). This color white light is described in "Explanation of Various Light Sources and Their Use in Visual Color Matching Applications," by GTI Graphic Technology, Inc., which is hereby incorporated by reference in its entirety. In brief, D65 is further described as "light bluish colored light source used in color matching applications of paints, plastics, textiles, raw inks, and other manufactured products. It is the only daylight source that was actually measured. The other daylight sources (D75 and D50) were mathematically derived from these measurements. It accentuates blue and subdues green and red. Commonly used as a primary light source in color measurement instrumentation. It is derived from the average of measurements made of light coming in a north facing window in the northern hemisphere on an overcast day at various times through the day at various times throughout the year."

Examples of exemplary RGBW devices, as well as detailed discussions of their implementations and benefits are described in the following illustrative references, which are hereby incorporated by reference in their entireties:

J. P. Spindler, T. K. Hatwar, M. E. Miller, A. D. Arnold, M. J. Murdoch, P. J. Kane, J. E. Ludwicki, P. J. Alessi, & S. A. Van Slyke, "System Considerations for RGBW OLED Displays;" *Journal of the Society for Information Display*, Vol. 14.1; p. 37 (2006).

J. P. Spindler, T. K. Hatwar, M. E. Miller, A. D. Arnold, M. J. Murdoch, P. J. Kane, J. E. Ludwicki, & S. A. Van Slyke, "Lifetime- and Power-Enhanced RGBW Displays Based on White OLEDs;" Journal of the Society for Information Display; p. 36 (2005).

S. A. Van Slyke, "Advanced Active Matrix OLED Technologies," Display and Components OLED Modules Business Unit, Eastman Kodak Company Rochester, N.Y., USA, Intertech (2004).

Hack et al. "High Efficiency Phosphorescent AMOLEDs: The Path to Long Lifetime TVs," Journal of the Society for Information Display, Vol. 42.1 (May 15, 2011).

U.S. Pat. Pub. No. 2006/0105198 to Spindler et al. entitled "Selecting white point for OLED devices."

U.S. Pat. Pub. No. 2010/0013748 to Cok et al. entitled "Converting Three-Component to Four Component Image."

U.S. Pat. App. Set. No. 13/185,063 to Levermore et at. entitled "RGBW Display for Extended Lifetime and Reduced Power Consumption."

It should be understood that the references listed above are merely illustrative and are by no means intended to be limiting.

In general, RGBW displays utilizing one or more color filters and one or more white OLED light sources may have higher power consumption in comparison to RGB-side-by-side displays (i.e. a display that comprises separate red, green, and blue emitting materials). For instance, RGBW displays utilizing one or more color filters having a two-component white OLED light source (e.g. blue and yellow emitting materials) may have a significant cut-off through the color filters so that the display may generate the primary colors of red and green. That is, each of the color filters may only allow light having particular wavelengths to pass through (and thus be emitted by) the corresponding sub-pixel, but will block (absorb or reflect) light having other wavelengths. This blocking by the color filter may thereby reduce the total light that is emitted from the sub-pixels (and the pixel as a whole).

Full-color AMOLED displays utilizing white emission (i.e. white OLEDs) and color filters have been considered to be a possible configuration to be used in mass-production of large-sized displays because this display configuration generally does not require precision shadow masking (i.e., the organic layers of one or more OLED light sources may be deposited as a blanket layer). However, as noted above, these OLED displays may also have significant drawbacks due to high power consumption because of the absorption (or reflection) of the emitted light by one or more of the color filters. To alleviate or reduce this disadvantage, such devices may provide a color conversion layer(s) between one or more color filters and the white OLED light source(s). In particular, in some embodiments the introduction of a color conversion (e.g. down conversion) layer(s) may improve the red and green emission of the sub-pixels and enhance the power efficiency of the device.

An example of an RGB display is described in U.S. Pat. No. 6,844,670 to Kuma entitled "Color Luminous Device," which is hereby incorporated by reference in its entirety. As shown, Kuma utilizes the emissions from the RGB sub-pixels for white emissions by matching the ratios of the light that is emitted for each of the colors. With reference to FIG. 3, a RGB display comprising red 308, green 307, and blue 306 color filters is shown. The device 300 is shown as comprising an organic layer 301 (comprising red, green, and blue emitting materials); and blue 310, green 311, and red 312 sub-pixels. The sub-pixels comprise: a color conversion layer 302 (comprising a green color conversion layer 304 and red color conversion layer 305), and color filters 303 (comprising a blue color filter 306, green color filter 307, and red color filter 308). The green color conversion layer 304 has an absorption spectrum such that light at shorter wavelengths (higher energy) is absorbed and an emission spectrum such that light at longer wavelengths (lower energy) is reemitted from the color conversion material. Similarly, the red color conversion layer 305 has an absorption spectrum such that it absorbs light having a shorter wavelength and reemits light having a longer wavelength.

Although the use of the color conversion layer may increase the efficacy of the red and green sub-pixels, such RGB displays (even comprising a color conversion layer) may still suffer from reduced efficacy because of the reduced light emissions from the relatively high amount of light that is blocked (reflected or absorbed) by the color filters.

OLED displays comprising an RGBW format have also been developed that include a "white" sub-pixel (e.g. a sub pixel that emits light from an OLED light source that does not comprise a color filter, examples of which were noted above and incorporated by reference), and have been considered as another potential display configuration that may provide display power efficiency. This is because the color coordinate of most images are generally localized around the white balance point of the display (that is, most of the color images comprise a significant proportion of white light). Therefore, in such embodiments, the white sub-pixel (which may not comprise a color filter) may be used most frequently in rendering images and thereby more light may be emitted without passing through a color filter (where portions of the light having certain wavelengths may be blocked). That is, by utilizing a white sub-pixel, such displays may have power efficiency because more light passes through the white sub-pixel and therefore less light will be blocked (e.g. absorbed or reflected) by a color filter.

Figure 4:
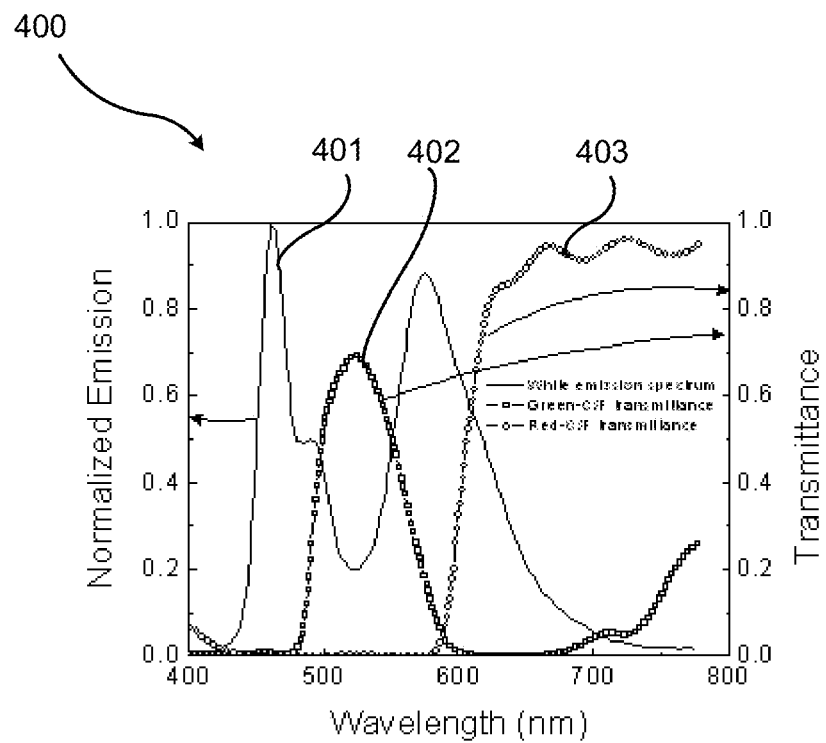
FIG. 4 shows a graph of an example of color transmittance spectra of a red and green color filter, which is on the same graph as the white emission spectrum of an exemplary two component white OLED light source.

Although RGBW displays utilizing one or more color filters may provide a more competitive display panel than an RGB display configuration, such designs may still suffer from higher power consumption than RGB side-by-side mode. This is illustrated, for instance, in M. Hack, W-Y So, P. A. Levermore, M. S. Weaver, and J. J. Brown, *RGBW Mode Has Higher Power Consumption than RGB Side-By-Side Mode*, SID 2011 Digest, 606-609 (2011), which is hereby incorporated by reference in its entirety. As noted above, the sub-pixels corresponding to the primary colors, R, G, and B, may have low current efficacy due to the absorption of light by the color filters. For instance, it may be preferred for simplicity in mass production that blue and yellow emitting materials are used to generate white light. However, the white spectrum of the light emitted by the blue and yellow emitters may have a significant mismatch between the yellow light emission and the transmittance of green and red color filters (an example of this is described in A. D. Arnold, P. E. Castro, T. K. Hatwar, M. V. Hettel, P. J. Kane, J. E. Ludwicki, M. E. Miller, M. J. Murdoch, J. P. Spindler, S. A. Van Slyke, K. Mameno, R. Nishikawa, T. Omura, and S. Matsumoto, *Full-color AMOLED with RGB Pixel Pattern*, Journal of the Society for Information Display 13, 525-535 (2005), which is hereby incorporated by reference in its entirety). This is also illustrated in FIG. 4, where the white spectrum of light 401, the green color filter transmittance spectrum 402, and the red color filter transmittance spectrum 403 are shown on the same graph 400. As shown, the white light spectrum 401 has peaks that do not correspond to the peaks for either the green color filter emission spectrum 402 or the red color filter emission spectrum 403. Therefore, while some light from the OLED light sources may be emitted (corresponding to the portions of the white spectrum 401 located beneath the lines representing the green color filter emission spectrum 402 or the red color filter emission spectrum 403), a large amount of the white light emitted by the white OLEDs is still blocked by these color filters in each of the corresponding sub-pixels. This may result in decreased power efficiency of the device for these sub-pixels.

The inventors have discovered that, in some embodiments, utilizing a color conversion layer in the red and/or green sub-pixels while employing an RGBW display configuration may result in increased efficiency in comparison to both RGB side-by-side display configurations as well as RGBW displays that do not comprises a color conversion layer. The color conversion layers may increase the efficacy of the red and/or green sub-pixels by converting light that passes through the sub-pixel from the white OLEDs at shorter wavelengths to light at higher wavelengths corresponding to the color of each sub-pixel. In this way, white light that would otherwise be blocked by the color filters of the red and green sub-pixels may be absorbed and reemitted at wavelengths corresponding to the color filters, and thereby increase the power efficacy of the device.

To illustrate some of the advantages that exemplary embodiments of an RGBW device comprising one or more color conversion layers may have in comparison to other exemplary OLED display configurations, the inventors performed a simulation comparing power consumption for (1) a RGB side-by-side display; (2) a RGBW display without color conversion layers in any of the sub-pixels; and (3) a RGBW display comprising color conversion layers in the red and green sub-pixels. It should be understood that this is provided for illustrations purposes only, and should not be considered limiting.

Power consumption was modeled for a 32" RGBW OLED display operating at 360 cd/m$^2$ while showing ten typical sample images. Power consumption was modeled for each sub-pixel and then total power consumption for the display was calculated by taking the sum of these values. This calculation was performed for each of the 10 sample images, and the average was then used to represent the power consumption of the display. Power consumption of the display was then calculated for two different white balances: (1) approximately D65, having color coordinates on the CIE 1931 XYZ color space chromaticity diagram of (0.313, 0.324), and (3) approximately D90, having color coordinates on the CIE 1931 XYZ color space chromaticity diagram of (0.284, 0.292).

Figure 5A:
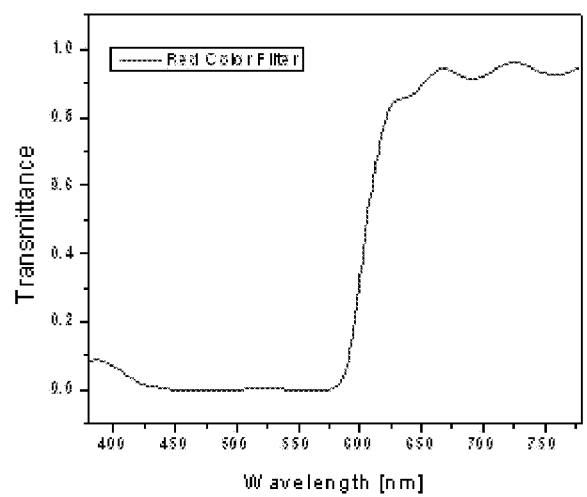
FIG. 5($a$) shows a transmission spectrum for the light that is transmitted through an exemplary red color filter.
Figure 5B:
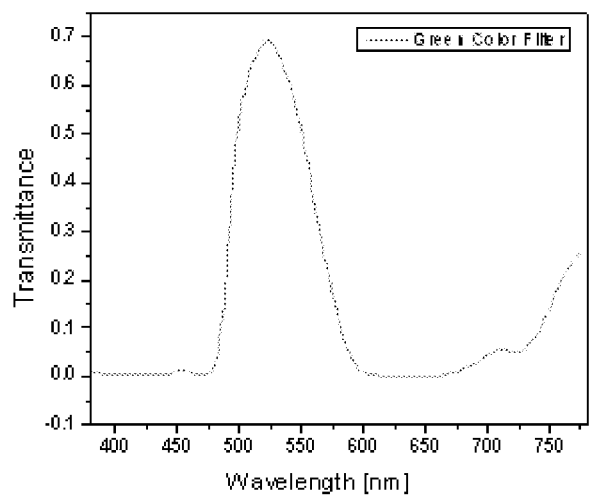
Figure 5C:
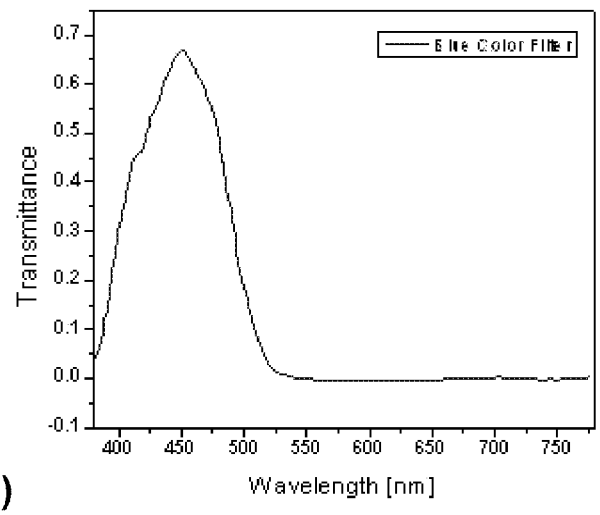

For purposes of this simulation, the transmittance spectra of the red, green, and blue color filters for the red, green, and blue sub-pixels, respectively, are shown in FIGS. 5(*a*)-(*c*). That is, an exemplary transmittance spectrum for a red color filter is shown in FIG. 5(*a*); an exemplary transmittance spectrum for a green color filter is shown in FIG. 5(*b*); and an exemplary transmittance spectrum for a blue color filter is shown in FIG. 5(*c*). It should be understood that this is for illustration purposes only, and any suitable color filter may be used.

Figure 6:
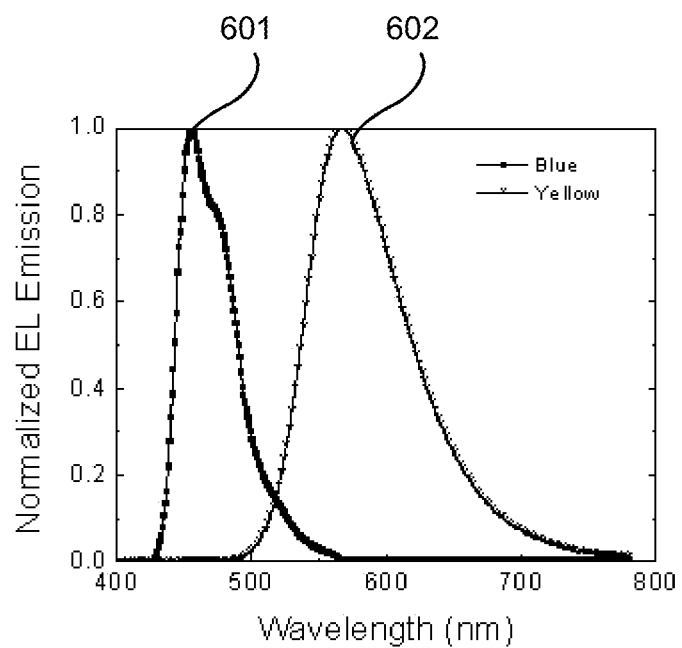
FIG. 6 shows a graph of the normalized emission spectra of blue and yellow emitting materials that may be used in an exemplary white OLED light source.

The following W sub-pixel OLED architecture was assumed for this exemplary simulation: a two-unit OLED device (having yellow and blue emitting materials) with one internal junction or charge generation layer (CGL). The yellow and blue emissions are from a phosphorescent system, having 40% external quantum efficiency (EQE), to emulate D65 and D90 white balance points. The emission spectra for the emitting materials for this simulation are shown in FIG. 6, with 601 showing the blue emissions spectrum and 602 showing the yellow emission spectrum. The voltage of the exemplary display, inclusive of the TFT was assumed to be 12 V (4 V for each OLED unit and 4 V for the TFT). It should again be noted that as described herein, each OLED corresponding to each sub-pixel is referenced as a separate OLED light source because each of the OLEDs may be individually addressable (i.e. individually controllable). However, in general each OLED light source may have the same common organic layers and/or a conductive layer or layers, which may be deposited as blanket layers and thereby decrease fabrication costs and expenses associated with patterning such layers and using different materials in different OLEDs.

For the exemplary device used in this simulation, the color conversion layers (CCLs) used were heterojunction phototransistors (HPTs) (disposed within the green sub-pixel, and thereby in optical communication with the white OLED and the green color filter) and Lumogen F300 (disposed within the re sub-pixel, and thereby in optical communication with the white OLED and the red color filter), having 90% and 80% PLQY respectively. It was assumed that each color conversion layer had a 90% peak absorption rate for purposes of this simulation, which the inventors have found is a typical and reasonable amount. It should be noted, however, that any suitable color conversion layer may be used in some embodiments to down convert light from the white OLED light sources as is desired.

Figure 7:
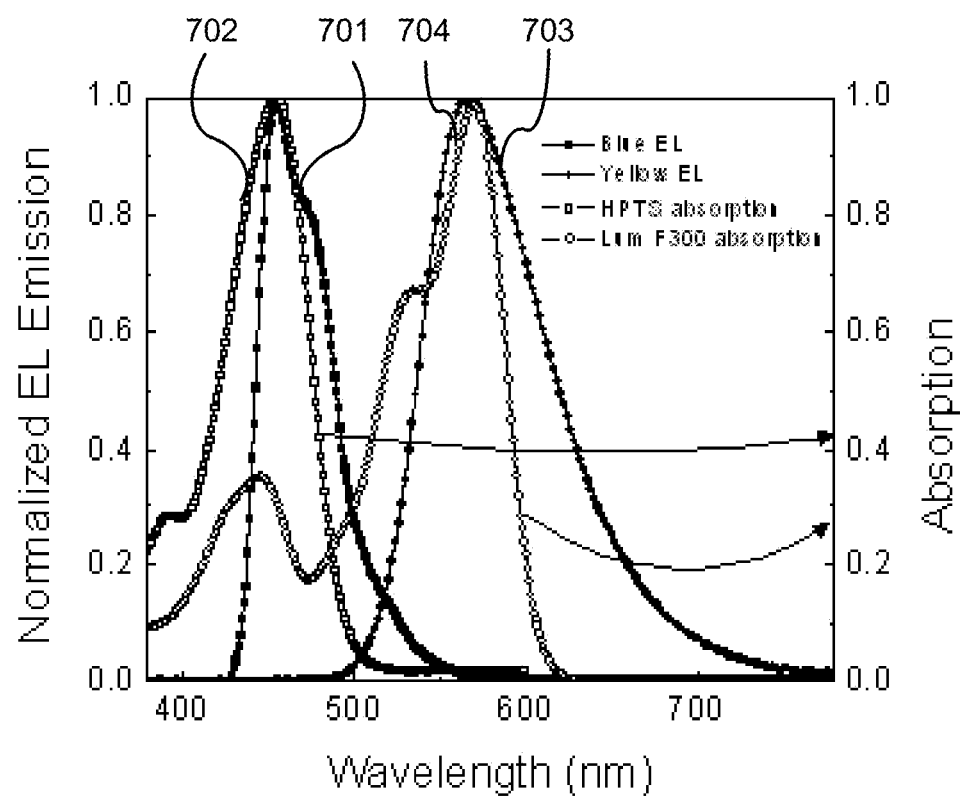
FIG. 7 shows a graph of the normalized emission spectra of a blue and yellow emitter on the same graph as the absorption spectra of two exemplary color conversion layers.

In general, the inventors have found that it may be preferred to match the absorption spectrum of the color conversion layer to the emission spectrum of the emitting materials for the OLEDs. In this manner, embodiments may provide more efficient sub-pixels and thereby lower the power consumption of the device. This is illustrated in FIG. 7 for the exemplary device used for this simulation. In particular, the emission spectrum of the blue emitting material 701 is shown as corresponding closely to the absorption spectrum of the HPTs color conversion layer 702, such that the peak of each spectra coincide relatively closely. In this manner, a large proportion of the blue light that is emitted by the exemplary white OLED light sources may be absorbed by the color conversion layer, and later reemitted at a longer wavelength rather than being blocked by the color filter. Similarly, the emission spectrum of the yellow emitting material 703 is shown as corresponding closely to the absorption spectrum of the Lumogen F300 color conversion layer 704, such that the peak of each spectra coincide relatively closely. In this manner, a large proportion of the yellow light that is emitted by the corresponding white OLED light sources may be absorbed by the color conversion layer, and later reemitted at a longer wavelength rather than being blocked by the color filter.

Figure 8:
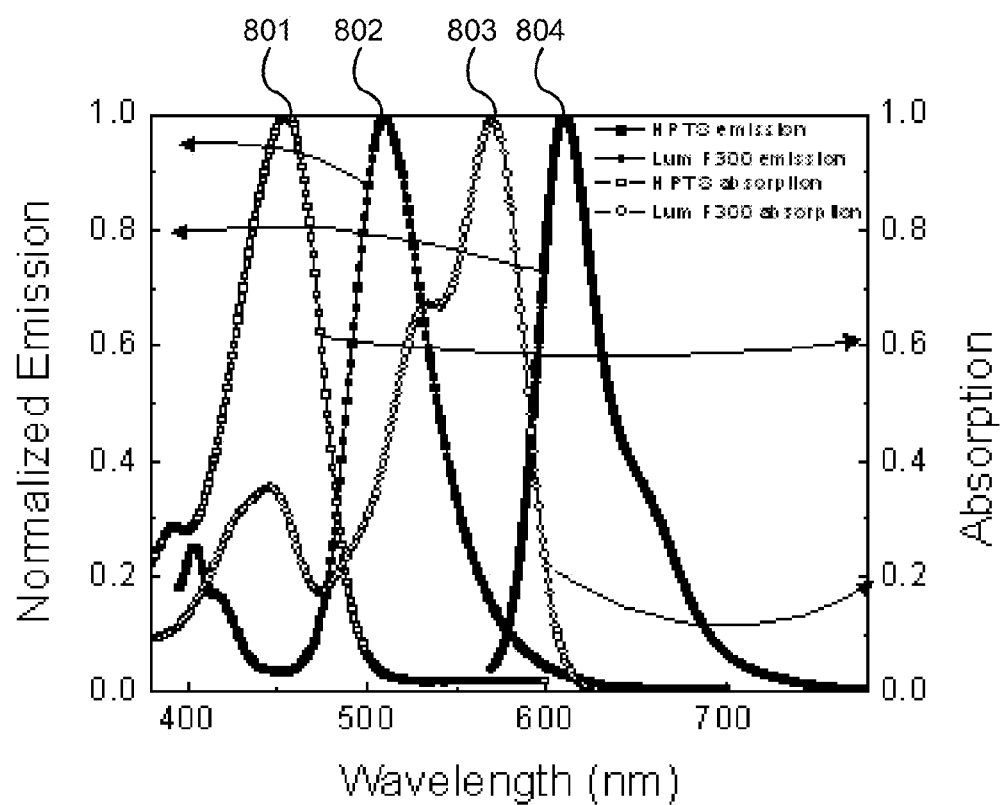
FIG. 8 shows a graph of the normalized absorption and emissive spectra of two exemplary color conversion layers.

The absorption and emission of the light by the color conversion layer is shown in FIG. 8 for the exemplary device used in this simulation. As shown, the absorption spectrum of HPTs 801 has a peak absorption rate for light having wavelengths between 400 and 500 nm, which generally corresponds to blue light. In addition, the HPTs have an emissive spectrum 802 that has a peak wavelength between 500 and 580 nm, which generally corresponds to green light. Thus, the HPTs may absorb a substantial amount of light that is emitted by the blue emitting material of the exemplary white OLED comprising two components, and reemit light having a peak wavelength corresponding to green light. In some embodiments, the HPTs may be disposed within the green sub-pixel, such that less of the light that is emitted by the corresponding white OLED is absorbed by the green color filter (that is, because the color conversion layer absorbs shorter wavelengths (e.g. blue light) and reemits light having longer wavelengths (e.g. green light) which are lacking in the white OLED), more light may be transmitted by the green color filter.

Continuing with reference to FIG. 8, as shown, the absorption spectrum of Lumogen F300 803 is illustrated as having a peak absorption rate for light having wavelengths between 580 and 600 nm, which generally corresponds to yellow light. In addition, the Lumogen F300 has an emissive spectrum 804 that is shown as having a peak wavelength between 600 and 700 nm, which generally corresponds to red light. Thus, the Lumogen F300 may absorb a substantial amount of light that is emitted by the yellow emitting material of the exemplary white OLED that comprises two components, and reemit light having a peak wavelength corresponding to red light. In some embodiments, the Lumogen F300 may be disposed within the red sub-pixel, such that less of the light that is emitted by the corresponding white OLED is absorbed by the red color filter (that is, because the color conversion layer absorbs shorter wavelengths (e.g. yellow light) and reemits light having longer wavelengths (e.g. red light) which are lacking in the white OLED), more light may be transmitted by the red color filter.

In addition, although not illustrated for this exemplary simulation, in some embodiments, multiple color conversion layers may be located within a single sub-pixel. For instance, the red sub-pixel could comprise both Lumogen F300 and HPTs color conversion layers as described above. The HPTs color conversion layer could be disposed between the white OLED and the Lumogen F300 color conversion layer, such that the HPTs may absorb the light at lower wavelengths (e.g. the blue light) and emit light at higher wavelengths that may be closer to the absorption spectrum of the Lumogen F300. In this way, more of the light emitted by the white OLED may be converted to longer wavelengths within the red sub-pixel, and thereby less light may be blocked by the red color filter. In some embodiments, another color conversion layer that may have an absorption spectrum corresponding to blue light and an emission spectrum corresponding to red light may also be used to down convert additional light emitted by the white OLED in the red sub-pixel. In general, the inventors have found that any suitable combination of color conversion layers within the sub-pixels may be used.

Table 1 below shows the power consumption results of the simulation for the exemplary RGBW device having CCLs as described above ("RGBW+CCL"), along with the simulation results for a similar RGB side-by-side device ("RGB SBS") and a RGBW device that does not comprise CCLs ("RGBW"):

TABLE 1

Power consumption for different white balance points.

| White Balance | | Power (W) | | |
|---|---|---|---|---|
| x | y | RGB SBS | RGBW | RGBW + CCL |
| D65 | 0.313 | 0.324 | 29.6 | 34.7 | 28.6 |
| D90 | 0.284 | 0.292 | 34.8 | 37.1 | 30.0 |

As shown in Table 1, the RGBW device having a color conversion layer had approximately a 20% reduction in power consumption in comparison to an RGBW device without the color conversion layers. Moreover, as shown in Table 1, the RGBW with color conversion layers is comparable in power consumption to the RGB side-by-side display configuration (and in fact had lower power consumption for this simulation). Thus, embodiments may provide for a decrease in manufacturing cost and complexity by, for example, allowing for blanket deposition of the emitting materials for a white OLED, while at the same time providing for a decrease in power consumption and a more efficient device.

Figure 9A:
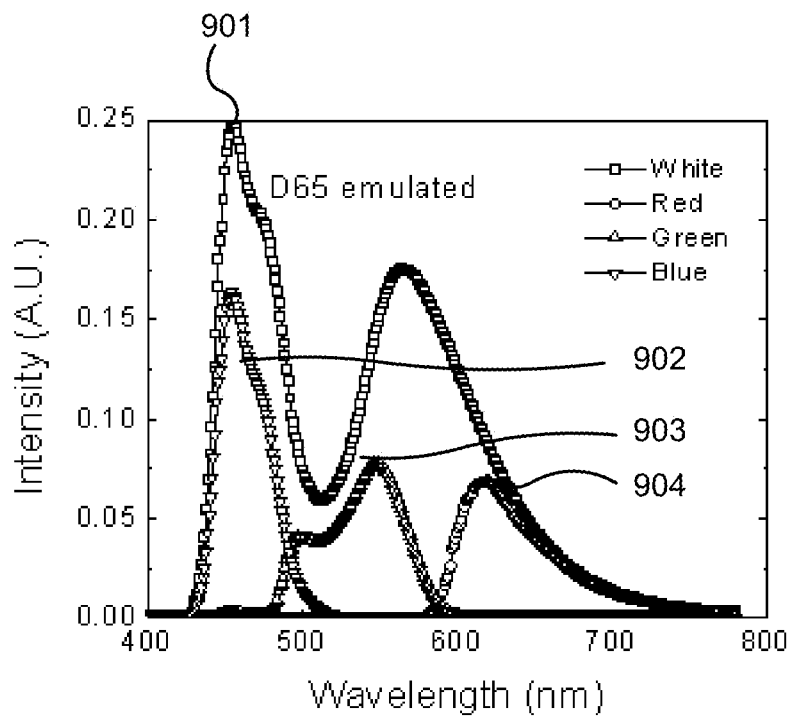
FIG. 9(a) shows the light output of a simulation of an RGBW OLED display that does not comprise a color conversion layer.

With reference to FIGS. 9(a) and (b), a comparison between the intensity of the light emissions of the RGBW display (without color conversion layers) and the intensity of the light emissions of the exemplary RGBW device comprising the color conversion layers disposed within the red and green sub-pixels is shown for white balance set to D65. FIG. 9(a) is a graph of the intensity of the light emissions for the RGBW display without color conversion layers. As shown, the white emission spectrum 901 for the light emitted from the white OLED (comprising blue and yellow emitting materials) is shown, with peaks corresponding to the peak wavelengths of the blue and yellow emitting materials. The intensity of the light emissions from the blue sub-pixel 902, the green sub-pixel 903, and the red sub-pixel 904 are also shown. FIG. 9(a) illustrates that the intensity of blue light 902 emitted though the blue sub pixel is higher than the intensity of light emitted from either the green sub-pixel 903 and red sub-pixel 904, which may be the result of the lack of correspondence between the transmittance of light by the green and red color filters and the peak wavelengths of the emissive spectrums of the blue and yellow emitting materials.

Figure 9B:
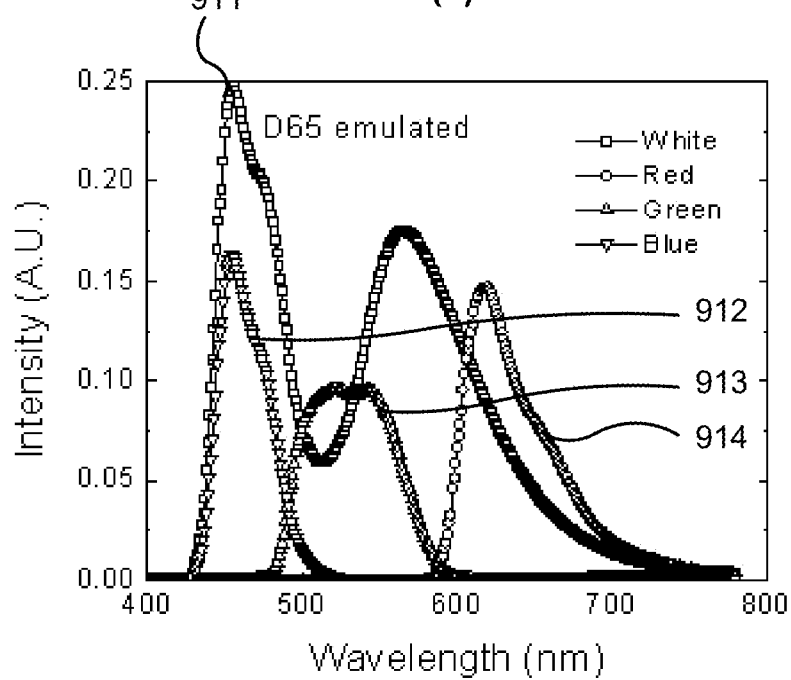
FIG. 9(b) shows the light output of a simulation of an exemplary RGBW OLED display that comprises color conversion layers in accordance with some embodiments.

FIG. 9(b) is a graph of the intensity of the light emissions for the RGBW display comprising color conversion layers for the green and red sub-pixels. As shown, the white emission spectrum 911 for the light emitted from the white OLED (comprising blue and yellow emitting materials) is shown for a white balance of D65, with peaks corresponding to the peak wavelengths of the blue and yellow emitting materials. It should be noted that this is the same as the emission spectrum for the white OLED in FIG. 9(a). The intensity of the light emissions from the blue sub-pixel 912, the green sub-pixel 913, and the red sub-pixel 914 for this exemplary device are also shown. FIG. 9(b) illustrates that the intensity of blue light 912 emitted though the blue sub pixel is the same as shown in FIG. 9(a) because there is no difference in the blue sub-pixel for these exemplary devices. However, as shown in FIG. 9(b), the intensity of light emitted from the green sub-pixel 913 is higher than the intensity of light emitted from the green sub-pixel 903 corresponding to the RGBW OLED display without color conversion layers. That is, the intensity of light emissions having wavelengths between 500 and 580 nm is approximately 0.1 A.U. in FIG. 9(b) corresponding to the OLED display having a color conversion in the green sub-pixel, whereas in FIG. 9(a) the intensity of light emissions having wavelengths between 500 and 550 nm is approximately 0.05 A.U., and the intensity of the light having wavelengths between 550-580 nm is approximately 0.075 A.U. Similarly, FIG. 9(b) illustrates that the intensity of light emitted from the red sub-pixel 914 is higher than the intensity of light emitted from the red sub-pixel 904 corresponding to the RGBW OLED display without color conversion layers. That is, the intensity of light emissions having wavelengths between 580 and 700 nm has a peak intensity of approximately 0.15 A.U. in FIG. 9(b) corresponding to the OLED display having a color conversion in the red sub-pixel, whereas in FIG. 9(a) the peak intensity of light emissions having wavelengths between 580 and 700 nm is approximately 0.075 A.U. As noted above, the stronger emission from the green and red sub-pixels in the RGBW display comprising color conversion layers may enable the device to achieve a more power-efficient RGBW display.

Some of the benefits that the use of one or more color conversion layers with a two peak emissive spectra (e.g. comprising yellow and blue emitting materials) may provide may be further illustrated by examining the relative amount of light that may be transmitted by each of the color filters in comparison to the total light emitted by the OLED light source corresponding to each sub pixel. The inventors performed a simulation using the exemplary OLED light sources, color filters, and color conversion layers for the red and green sub-pixels as described above. The results of the simulation are shown in Table 2 (having white balance set to D65) and Table 3 (having a white balance set to D90) below:

TABLE 2

Percentage of light transmission of each sub-pixel for a white balance of D65

|  | Blue Sub-Pixel (% of light transmitted) | Green Sub-Pixel (% of light transmitted) | Red Sub-Pixel (% of light transmitted) |
| --- | --- | --- | --- |
| CF + CC | 22.35% | 25.78% | 34.16% |
| CF only | 22.35% | 16.53% | 17.45% |

TABLE 3

Percentage of light transmission of each sub-pixel for a white balance of D90

|  | Blue Sub-Pixel (% of light transmitted) | Green Sub-Pixel (% of light transmitted) | Red Sub-Pixel (% of light transmitted) |
| --- | --- | --- | --- |
| CF + CC | 18.60% | 24.77% | 37.06% |
| CF only | 18.60% | 17.06% | 19.77% |

Note that in Tables 2 and 3, "CF+CC" refers to embodiments that comprise both color filters and color conversion layers for the red and green sub-pixels, whereas "CF only" refers to a device that comprises only color filters. As can be seen from Tables 2 and 3, there is a significant increase in the percentage of light that is transmitted by the green and red sub-pixels with the inclusion of a color conversion layer. As explained in detail above, in some embodiments that comprise a two component organic layer (i.e. comprising two emitting materials), the emission spectra of the emitting materials may not correspond to the transmission spectra of the red and green color filters, thereby resulting in relatively high losses (e.g. a large amount of light is absorbed or reflected by the color filters rather than transmitted). In fact, and unexpectedly, in this exemplary simulation, when the example device was set to a white balance of D65 (which comprises higher concentrations of blue light), the green and red sub-pixels through the use of color conversion layers were actually found to have higher transmission percentages than the blue sub-pixel, even though the transmission spectrum of the blue color filter may closely match the emissive spectrum of the blue emitting material (compare 22.35% transmission rate for the blue sub-pixel, with 25.78% for the green sub-pixel and 34.16% for the red sub-pixel). Thus, in general, the use of one or more color conversion layers may in some embodiments, improve the efficiency and performance of an RGBW OLED display.

In this regard, embodiments that comprise some of the features and/or aspects of the exemplary embodiments described above may have advantages over similar devices, some of which were described above. For instance, embodiments of devices comprising an RGBW OLED display having one or more color conversion layers disposed within one or more of the sub-pixels may provide advantages over RGB displays (e.g. RGB side-by-side displays) and/or RGBW displays that do not comprise a color conversion layer. For example, some embodiments may provide an OLED display that has reduced power consumption because of the reduction in light that is blocked by a color filter in one or more of the sub-pixels. By reducing power consumption, some embodiments may operate more efficiently, thereby using less power and also extending the lifetime of the OLED light sources. Moreover, in some embodiments, the increased efficiency coincides with the use of white OLED light sources (e.g. OLED light source that may comprise a common, two component, organic emitting layer), which generally does not require deposition through a fine metal mask or other expensive and/or complex fabrication process for most of the components (although one of the electrodes may be patterned in some embodiments so as to allow each individual OLED corresponding to each sub-pixel to be addressed). This may reduce the fabrication costs of such exemplary devices, while the devices may remain relatively competitive with similar displays in terms of efficacy of the sub-pixels.

Figure 10:
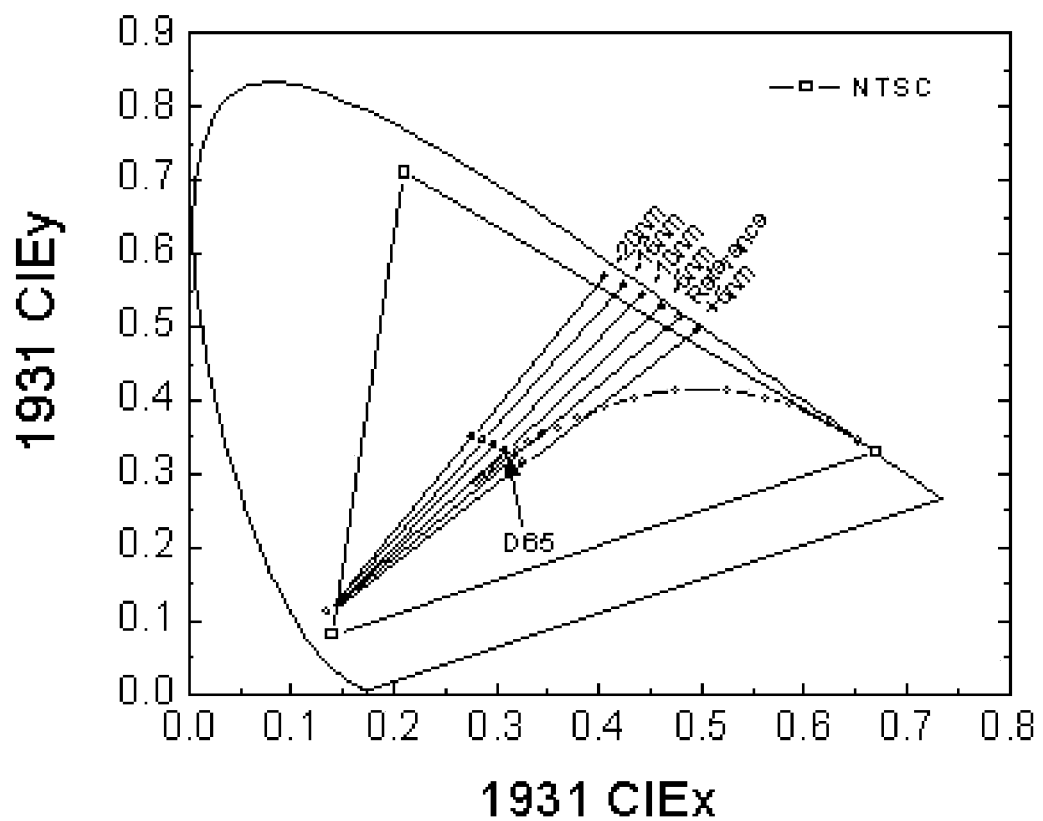
FIG. 10 shows a graph of white balance points in accordance with some embodiments.

In addition, and as will be described below with reference to FIGS. 10 and 11, some embodiments of an RGBW OLED display having one or more color conversion layers may have the advantage of having less dependence on the off-the-white-balance value, measured by Duv. That is, RGBW devices typically have an increase in power consumption when the light emissions of the white OLED light source do not match the white balance set for the device. As was noted above, most images (and the underlying colors) comprise a large proportion of the color "white." If the white light emitted by the white OLED light sources does not match the color white for the display (which corresponds to the white balance), then additional inefficient red, blue, and/or green color light may need to be added to correct for this error (which may require more light to be passed through each of the color filters, thereby reducing the power efficiency of the device). As was described above, the introduction of one or more color conversion layers may reduce the power consumption dependence significantly because more light may be passed through the color sub-pixels with less power loss from the color filter blocking portions of the spectrum of the emitted light. In some embodiments, this may provide for a better tolerance of manufacturing (i.e. more or greater manufacturing errors in the deposition of the organic stack of the white OLEDs, or other components of the device, may be tolerated) and/or embodiments may also provide for a larger selection of materials that may be used for the OLEDs. In general, the higher tolerance to error and the increase in the number of materials that may be used for such devices may reduce manufacturing costs and also increase the number of devices that are determined to be suitable for their intended purposes. Furthermore, the decrease in dependence on emitting white light that corresponds to the white point of the device may, in some embodiments, provide for devices that have longer lifetimes because the devices may be more tolerant to the degradation of the device through operation (and in particular, the differential aging of the different emitting materials).

To illustrate this advantage regarding a decrease dependence on off-the-white-balance value that some embodiments may comprise, a simulation was conducted by the inventors. The light emissions from the exemplary white OLED were varied by changing the peak wavelength of the yellow emitting material to generate off-balanced white colors. The range of values are shown in FIG. 10, which illustrates the relative difference between D65 white light and the white light for the off-white simulations in terms of the difference in peak wavelength. As shown in FIG. 10, the off-white point was set by varying the yellow emitting material by −20 nm (i.e. 20 nm shorter than the reference white light), −15 nm, −10 nm, −5 nm, and +5 nm. The Duv value was then determined as a minimal distance from a D65 point at any given settings for the yellow emitting material. The power consumption for the device for each corresponding Duv was then calculated for a device comprising color conversion layers and a similar device that did not comprise color conversion layers. In general, the off-balanced white from D65 (or any other white balance point) may cause higher power consumption because it may involve saturated colors (i.e. the R-G-B sub-pixels may be used more to compensate for the off-balance), rather than using the more efficient white sub-pixel. This may be one reason why it may be preferred to achieve on-balanced white in some RGBW devices. The results for an exemplary device comprising color conversion layers ("labeled as CF+CCL") and an embodiment that does not comprise color conversion layers ("CF") are shown in FIG. 11.

Figure 11:
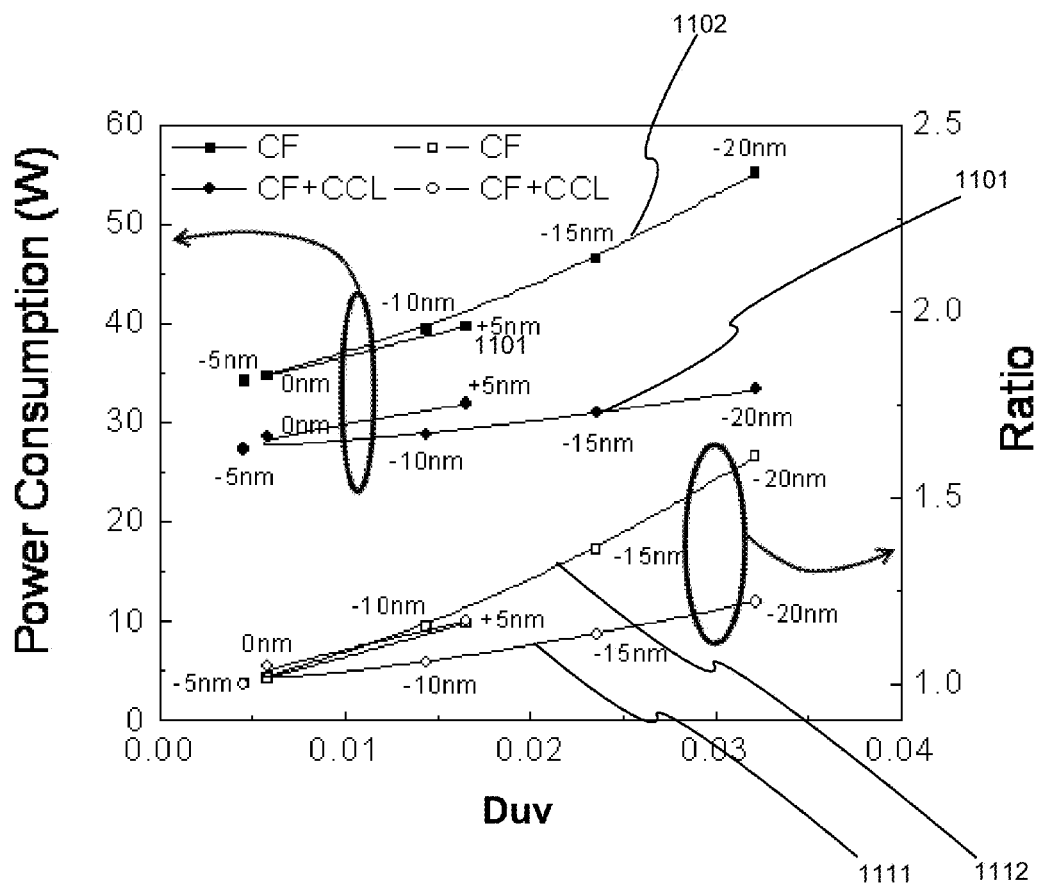
FIG. 11 shows power consumption data for an RGBW comprising color filters and an RGBW embodiment comprising color filters and color conversion layers for various white points in accordance with some embodiments.

As can be seen in FIG. 11, the display that comprises a color conversion layer in addition to color filters (corresponding to graphs labeled as 1101 and 1111) not only has lower power consumption overall, but the power consumption does not increase as rapidly with increases in Duv associated with the difference between the white light emitted by the OLED of the device and the white balance of the device, here D65 (that is, there is not a strong relationship between power consumption and Duv). Indeed, the lines 1101 and 1111 appear relatively flat, meaning that an increase in the Duv does not lead to a large increase in power consumption, and thereby power consumption is largely independent in some embodiments of the difference between the white light emitted by the white OLED and the white balance of the display. In contrast, the power consumption of the exemplary RGBW display that did not comprise color filters (corresponding to graphs 1102 and 1112) increased at a much higher rate as the distance from the white balance (measured as Duv) was increased. In general, this increase in power consumption that is dependent on the white balance point may pose limitations in choosing materials and narrow the process window in actual applications for some devices. The open symbols are normalized to the minimum values (in this case −5 nm) so as to provide the ratio of the increase in power consumption as shown corresponding to the right axis (i.e. "Ratio" axis).

Exemplary Embodiments

Described below are exemplary embodiments of power efficient RGBW displays. The embodiments described herein are for illustration purposes only and are not thereby intended to be limiting. After reading this disclosure, it may be apparent to a person of ordinary skill that various components and/or features as described below may be combined or omitted in certain embodiments, while still practicing the principles described herein.

Embodiments described herein may provide for devices comprising a power efficient RGBW display. In some embodiments, a first device may be provided. The first device may include at least one pixel. The pixel may include a first sub-pixel, a second sub-pixel, a third sub-pixel, and a fourth sub-pixel. The first sub-pixel may include a first organic light emitting device and a first color filter in optical communication with the first organic light emitting device, where the first color filter may be adapted to preferentially pass light from the first organic light emitting device having a peak wavelength in the visible spectrum between 580 and 700 nm. The second sub-pixel may include a second organic light emitting device and a second color filter in optical communication with the second organic light emitting device, where the second color filter may be adapted to preferentially pass light from the second organic light emitting device having a peak wavelength in the visible spectrum between 500 and 580 nm. The third sub-pixel may include a third organic light emitting device and a third color filter in optical communication with the third organic light emitting device, where the third color filter may be adapted to preferentially pass light from the third organic light emitting device having a peak wavelength in the visible spectrum between 400 and 500 nm. The fourth sub-pixel may emit near white light. As used herein, "near white light" may refer to light having a first point on a chromaticity diagram that lies within a Duv distance of 0.010 from the Planckian locus.

As noted above, the first, the second, the third, and the fourth organic light emitting devices are identified separately because each organic device may, in some embodiments, be individually addressable and may thereby correspond to one of the sub-pixels (i.e. each OLED may be optically coupled to one sub-pixel). In some embodiments, each of the sub-pixels may have a patterned electrode such that each OLED may be operated separately (and thereby each of the sub-pixels may essentially be turned "on" and "off," or have the amount of light emitted by the sub-pixel varied based on the amount of current or voltage supplied to its corresponding OLED). However, in some embodiments, each of the organic devices may also share one or more common layers (such as a common organic layers and/or a common electrode), which may decrease the cost of the fabrication process associated with patterning such layers and/or using different materials. For example, each organic light emitting device may comprise a white OLED having the same emissive materials in the same concentration levels.

Embodiments may comprise many of the same features as a typical RGBW display, such as those described above and/or incorporated by reference. However, at least one of the first sub-pixel or the second sub-pixel may include a color conversion layer in optical communication with the first or the second organic light emitting device. As was defined above, the color conversion layer may comprise any material such that it may absorb light having certain (usually shorter) wavelengths (corresponding to its absorption spectrum) and then reemit light at longer wavelengths than the wavelengths that were absorbed (corresponding to its emission spectrum). At least one color conversion layer may be disposed between the first or the second organic light emitting device and either the first or the second color filter. Indeed, such an arrangement may be preferred as the light that is emitted from the first light source (which may comprise, for example, light having a plurality of wavelengths) may first be absorbed by the color conversion layer within one of the sub-pixels, and then the light may be reemitted at longer wavelengths. In this manner, light that may otherwise have been blocked by the color filter of the sub-pixel if the color conversion layer was not present, may be reemitted by the color conversion layer so as to have a wavelength that may be allowed to pass through the color filter and thereby be emitted by the sub-pixel.

Figure 12:
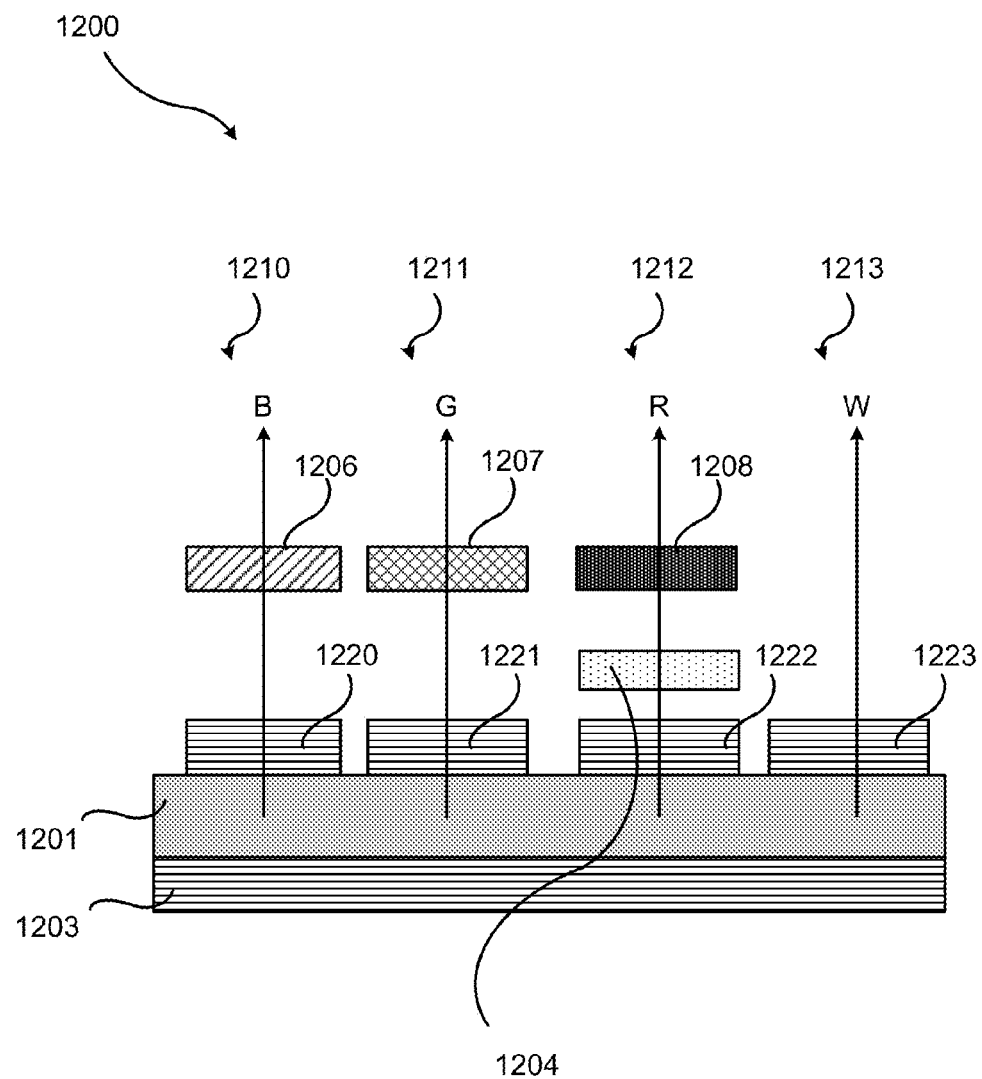
FIG. 12 shows an exemplary pixel of a RGBW OLED display comprising a color conversion layer in accordance with some embodiments.

Exemplary embodiments of a first device in accordance with some of the features described above are shown in FIGS. 12-14. With reference to FIG. 12, an exemplary device 1200 (or a pixel of a device) is shown as comprising four sub-pixels: a blue sub-pixel 1210 comprising a blue color filter 1206; a green sub-pixel 1211 comprising a green color filter 1207; a red sub-pixel 1212 comprising a red color filter 1208; and a white sub-pixel 1213, which is shown as not comprising a color filter. Each of the sub-pixels 1210-1213 further comprises a white OLED light source comprising a common organic layer 1201, common electrode 1203, and patterned electrode 1220-1223 (respectively). That is, for instance, the blue sub-pixel 1210 comprises the OLED having electrode 1220; the green sub-pixel 1211 comprises the OLED having electrode 1221; the red sub-pixel 1212 comprises the OLED having electrode 1222; and the white sub-pixel 1213 comprises the OLED having electrode 1223. Each of the OLEDs corresponding to the patterned conductive layer 1220-1223 is in optical communication with one of the sub-pixels and the components therein (which is shown by the vertical lines in each sub-pixel representing the transmission of light through each sub-pixel). The exemplary device 1200 also comprises a color conversion layer 1204 disposed within the third sub-pixel 1212 (e.g. the red sub-pixel). Thus, as shown in this exemplary embodiment, in operation the light that is emitted by the OLED light source corresponding to electrode 1220 may pass through the blue sub-pixel 1210 and selectively transmitted by the blue color filter 1206; the light that is emitted by the OLED light source corresponding to electrode 1221 may pass through the green sub-pixel 1211 and may be selectively transmitted by the green color filter 1207. The light emitted by the OLED light source corresponding to electrode 1223 may pass through the white sub-pixel 1213 relatively unimpeded (such that the light emitted by the fourth sub-pixel may correspond to the light emitted by the OLED light source corresponding to the electrode 1223). The light from the OLED light source corresponding to electrode 1222 that enters the red sub-pixel 1212 may contact the color conversion layer 1204, which may absorb some of the light having wavelengths corresponding to the color conversion layer's absorption spectrum, and then reemit light at a longer wavelength (e.g. red light in accordance with its emission spectrum). This reemitted light may then contact the red color filter 1208, which may then allow such light to be emitted from the red sub-pixel 1212 (assuming that the light has a wavelength that corresponds to the transmittance spectrum of the color filter). It should be noted that, without the color conversion layer 1204, the light (or a portion thereof) having wavelengths such that it would be absorbed and reemitted by the color conversion layer 1204 may have been blocked by the red color filter 1208, thereby reducing the power efficiency of the red sub-pixel 1212.

Figure 13:
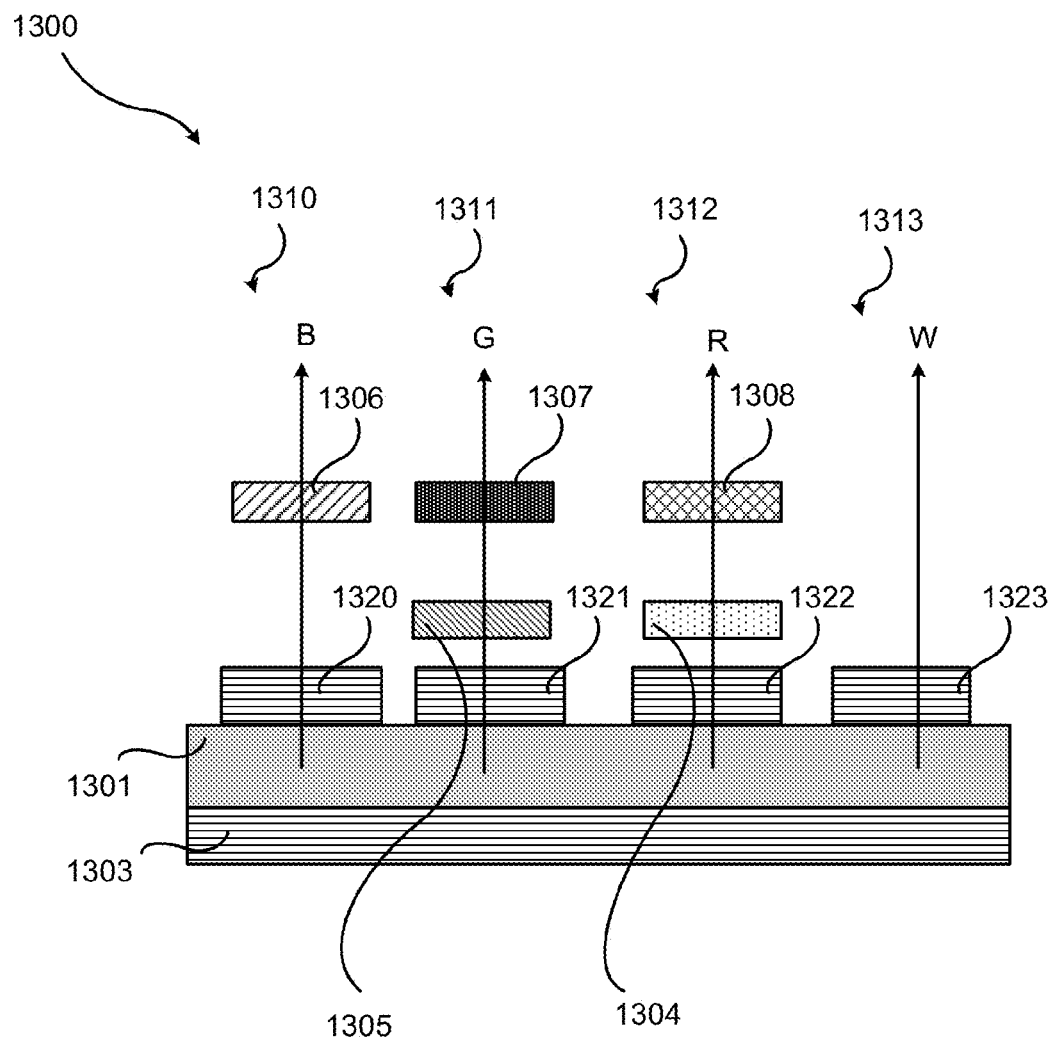
FIG. 13 shows an exemplary pixel of a RGBW OLED display comprising a plurality of color conversion layers in accordance with some embodiments.

With reference to FIG. 13, another exemplary device 1300 (or pixel of a device) that is similar to the exemplary device 1200 shown in FIG. 12 is illustrated as comprising four sub-pixels: a blue sub-pixel 1310 comprising a blue color filter 1306; a green sub-pixel 1311 comprising a green color filter 1307; a red sub-pixel 1312 comprising a red color filter 1308; and a white sub-pixel 1313, which is shown as not comprising a color filter. Each of the sub-pixels 1310-1313 further comprises a white OLED light source comprising a common organic layer 1301, common electrode 1303, and patterned electrode 1320-1323 (respectively). That is, for instance, the blue sub-pixel 1310 comprises the OLED having electrode 1320; the green sub-pixel 1311 comprises the OLED having electrode 1321; the red sub-pixel 1312 comprises the OLED having electrode 1322; and the white sub-pixel 1313 comprises the OLED having electrode 1323. Each of the OLEDs corresponding to the patterned conductive layer 1320-1323 is in optical communication with one of the sub-pixels and the components therein (which is shown by the vertical lines in each sub-pixel representing the transmission of light through each sub-pixel). The exemplary device 1300 also comprises a first color conversion layer 1304 disposed within the red sub-pixel 1312, and a second color conversion layer 1305 disposed within the green sub-pixel 1311. Thus in operation, the light emitted by the blue sub-pixel 1310, the red sub-pixel 1312, and the white sub-pixel 1313 will be the same as that described with reference to FIG. 12. However, the light that is emitted by the OLED light source corresponding to electrode 1321 that enters the green sub-pixel 1311 will contact the second color conversion layer 1305, which may absorb some of the light having wavelengths corresponding to the color conversion layer's absorption spectrum (e.g. blue light), and then reemit light at a longer wavelength (e.g. green light in accordance with its emission spectrum). This reemitted light may then contact the green color filter 1307, which may then transmit the light from the green sub-pixel 1311 (assuming that the light has a wavelength that corresponds to the transmittance spectrum of the color filter). It should be noted that, without the color conversion layer 1305, the light (or a portion thereof) having wavelengths such that it would be absorbed and reemitted by the color conversion layer 1305 may have been blocked by the green color filter 1307, thereby reducing the power efficiency of the green sub-pixel 1311. Thus, the exemplary embodiment shown in FIG. 13 comprises two color conversion layers, which may thereby increase the power efficiency of both the green and the red sub-pixel by converting the shorter wavelength light emissions from the white OLED 1301 into light having longer wavelengths.

Figure 14:
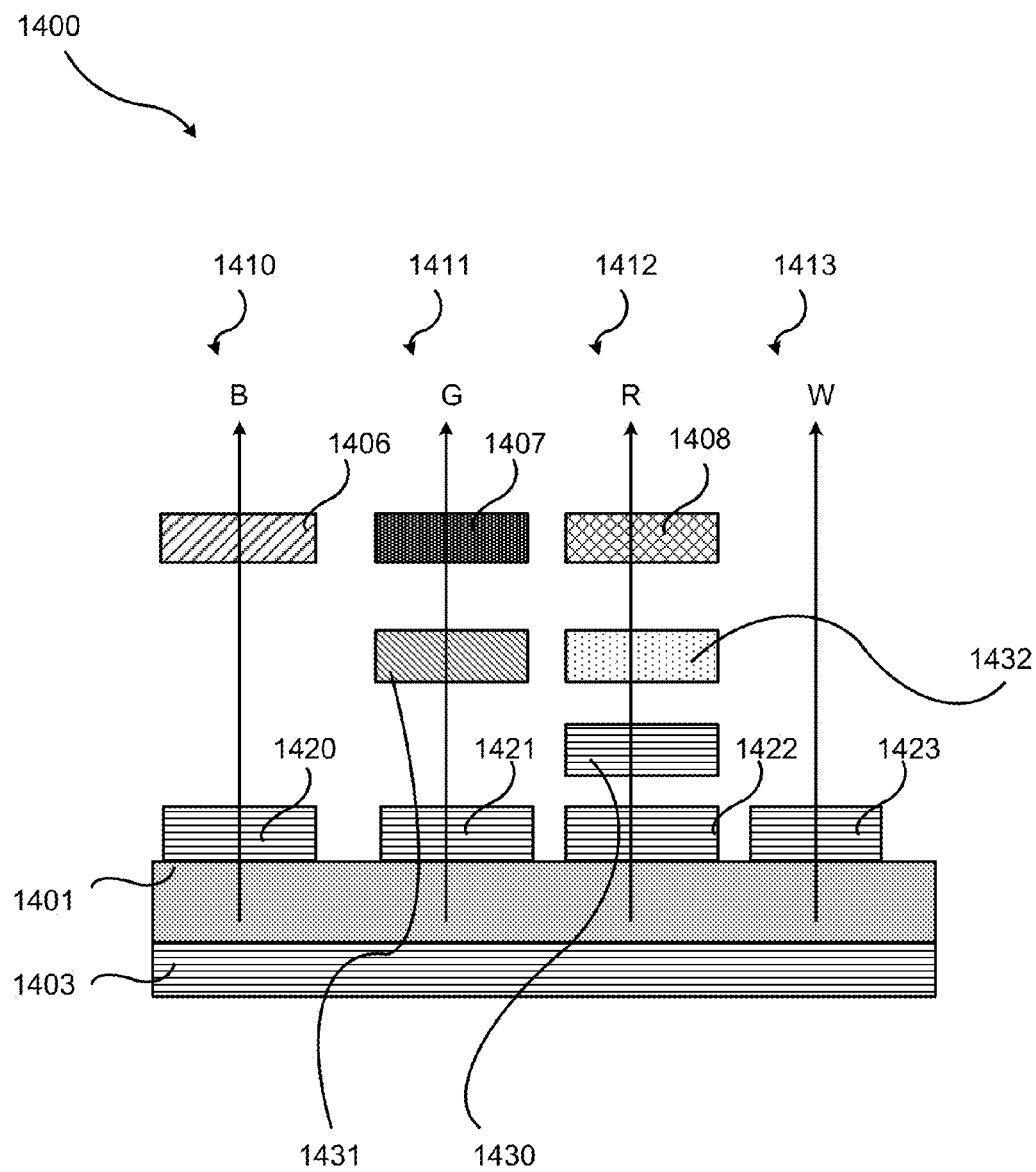
FIG. 14 shows an exemplary pixel of a RGBW OLED display comprising a plurality of color conversion layers in accordance with some embodiments.

With reference to FIG. 14, an exemplary device 1400 (or pixel of a device) that is similar to the exemplary device 1300 shown in FIG. 13 is illustrated as comprising four sub-pixels: a blue sub-pixel 1410 comprising a blue color filter 1406; a green sub-pixel 1411 comprising a green color filter 1407; a red sub-pixel 1412 comprising a red color filter 1408; and a white sub-pixel 1413, which is shown as not comprising a color filter. Each of the sub-pixels 1410-1313 further comprises a white OLED light source comprising a common organic layer 1401, common electrode 1403, and patterned electrode 1420-1423 (respectively). That is, for instance, the blue sub-pixel 1410 comprises the OLED having electrode 1420; the green sub-pixel 1411 comprises the OLED having electrode 1421; the red sub-pixel 1412 comprises the OLED having electrode 1422; and the white sub-pixel 1413 comprises the OLED having electrode 1423. Each of the OLEDs corresponding to the patterned conductive layer 1420-1423 is in optical communication with one of the sub-pixels and the components therein (which is shown by the vertical lines in each sub-pixel representing the transmission of light through each sub-pixel). The exemplary device 1400 also comprises a first color conversion layer 1430 disposed within the red sub-pixel 1412, a second color conversion layer 1431 disposed within the green sub-pixel 1411, and a third color conversion layer 1432 which is also disposed in the red sub-pixel 1412. Thus in operation, the light emitted by the blue sub-pixel 1410, the green sub-pixel 1411, and the white sub-pixel 1413 may be the same as that described with reference to FIG. 13 (assuming each of the components is the same). However, the light that is emitted from the OLED light source corresponding to the electrode 1422 that enters the red sub-pixel 1412 may contact two color conversion layers: 1430 and 1432. In some embodiments, each of these color conversion layers may have a different absorption spectrum such that the first color conversion layer (shown in FIG. 14 as 1430, which is disposed between the second color conversion layer 1432 and the OLED light source corresponding to electrode 1422) may absorb light primarily within a range of wavelengths (e.g. blue light), and the second color conversion layer 1432 may absorb light primarily within a different range of wavelengths (e.g. green or yellow light). Each of the color conversion layers may reemit light having longer wavelengths that may correspond to the transmittance spectrum of the red color filter 1408. In this way, the red sub-pixel 1412 may reduce power consumption even further, as more of the light having shorter wavelengths may be converted to red light that may be emitted by the red sub-pixel 1412 (which may have otherwise been blocked by the red color filter 1408). In some embodiments, the first color conversion layer 1430 may have an emission spectrum such that light that is reemitted may have wavelengths that correspond to the absorption spectrum of the second color conversion layer 1432. The second color conversion layer 1432 may then absorb the reemitted light from the first color conversion layer 1430 (along with any light from the first OLED light source 1401), and may reemit this light in accordance with its emission spectrum.

The embodiments shown in FIGS. 12-14 are provided for illustration purposes, and are in no way intended to be limiting. The components of the exemplary devices, as well as the configurations these components may be disposed relative to the others, may be altered in some embodiments according to the particular application the device is to be used for. Indeed, a device may have any number of color conversion layers, and any number of color filters, so long as it functions for an intended purpose.

As may be described below with reference to one or more exemplary embodiments, in some embodiments where the first sub-pixel (e.g. red sub-pixel) may comprise a color conversion layer, the color conversion layer may, for instance, comprise a material having an absorption spectrum having a peak wavelength that is less than 600 nm (e.g. blue, green, or yellow light) and an emission spectrum having a peak wavelength between 580 and 700 nm (e.g. red light). In this manner, the color conversion layer could absorb the light corresponding to—e.g., yellow emissions (e.g. from yellow emitting material). In some embodiments, if the second sub-pixel (e.g. green sub-pixel) comprises a color conversion layer (such as the embodiments shown in FIG. 13), then the color conversion layer may comprise a material having an absorption spectrum having a peak wavelength that is less than 500 nm (e.g. blue light) and an emission spectrum having a peak wavelength between 500 and 580 nm (e.g. green light). In this manner, the green and the red sub-pixels may thereby have increased efficiency by increasing the light that is emitted from the sub-pixels by decreasing the amount of light in the sub-pixels that is blocked by the respective color filters.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the first color conversion layer and/or the second conversion layer may have a photoluminescence quantum yield (PLQY) of at least 40%. The photoluminescence quantum yield may relate to the efficiency of the fluorescence or phosphorescence process in the color conversion layer for absorbing and reemitting photons. That is, for instance, the PLQY may provide the amount of light that is absorbed by the color conversion layer and compare that to the amount of light that is reemitted at a longer wave length. The PLQY may be defined as the ratio of the number of photons emitted to the number of photons absorbed. In general, it is preferred to have a high PLQY because this indicates that a higher proportion of the light emitted by the first light source that would otherwise likely be blocked by the color filter of one of the sub-pixels is being converted to longer wavelengths that may correspond to the transmittance spectrum of the color filter. Thus, in some embodiments, the first color conversion layer and/or the second conversion layer may have a PLQY of at least 60%. In some embodiments, the first color conversion layer and the second conversion layer may have a PLQY of at least 80%. As noted above, it may be reasonable in some embodiments that the PLQY for the color conversion layer may be greater than 90%, which may provide for a reduction in power consumption for an RGBW OLED display.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the first color conversion layer may have a thickness that is between approximately 0.1 and 100 microns. In general, the thickness of the color conversion layer (where the thickness may be the dimension of the color conversion layer that is substantially parallel to the direction that the majority of light emitted from the first light source passes through the color conversion layer) may affect the absorption rate (e.g. PLQY) of the color conversion layer. Typically, the larger the thickness of the color conversion layer, the higher the absorption rate. However, the color conversion layer may be disposed in a sub-pixel in an OLED display, where there may be limited space and thus it may be desirable to limit or reduce the thickness to the extent reasonable. The inventors have found that, in general, a color conversion layer of at least 0.1 microns is thick enough to provide a reasonable amount of absorption of the light emitted by the first light source to reduce power consumption. The inventors have also found that, in most cases, a thickness of less than 100 microns should be small enough to be utilized in most OLED display embodiments. In some embodiments, in the first device as described above, the second color conversion layer may have a thickness that is between approximately 0.1 and 100 microns.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the first color conversion layer may have a dye concentration between approximately 0.1% and 40%. In some embodiments, in the first device as described above, the second color conversion layer may have a dye concentration between approximately 0.1% and 40%. As described above, the color conversion layer may comprise any suitable material and in general, the material that may comprise a color conversion layer is known in the art. In addition, the absorption and emission characteristics of the color conversion layer may depend on such variables as the material and thicknesses chosen, and a person of ordinary skill in the art would typically be able to choose these variables to achieve a desired property for the color conversion layer.

That is, in general, the dyes that may comprise a color conversion layer are not particularly limited. For example, any suitable compounds may be used so that the color conversion layer may be capable of converting the chromaticity of light emitted from a light source to a different chromaticity. That is, in some embodiments, the color conversion layer may function as a wavelength conversion element that is capable of converting the wavelength of the light from the light source to a different wavelength (e.g. to light having a peak wavelength that is at least 10 nm longer than that of the light emitted by the light source). In some embodiments, the color conversion layer may comprise an organic fluorescent substance, an inorganic fluorescent substance, or a phosphorescent substance, and may be selected according to the particular application or function of the device (e.g. a desired wavelength).

Some examples of the materials that may be used for a color conversion layer may include, but are not limited to, the following classes: xanthen, acridine, oxazine, polyene, cyanine, oxonol, benzimidazol, indolenine, azamethine, styryl, thiazole, coumarin, anthraquinone, napthalimide, aza[18]annulene, porphin, squaraine, fluorescent protein, 8-hydroxyquinoline derivative, polymethin, nanocrystal, protein, perylene, phthalocyanine andmetal-ligand coordination complex.

Some examples of a fluorescent dye for converting the luminescence of UV and higher energy light to blue light may include, but are not limited to: the styryl-based dyes such as 1,4-bis(2-methylstyryl)benzene, and trans-4,4'-diphenylstilbene, and coumarin based dyes such as 7-hydroxy-4-methylcoumarin, and combinations thereof.

Some examples of a fluorescent dye for converting luminescence of blue light to green light may include, but not are not limited to: the coumarin dyes such as 2,3,5,6-1H,4H-tetrahydro-8-trifluoromethylquinolizino(9,9a,1-gh) coumarin, 3-(2'-benzothiazolyl)-7-diethylaminocoumarin, 3-(2'-benzimidazolyl)-7-N,N-diethylaminocoumarin, and naphthalimide dyes such as Basic Yellow 51, Solvent yellow 11 and Solvent Yellow 116, and pyrene dyes such as 8-Hydroxy-1,3,6-pyrenetrisulfonic acid trisodium salt (HPTS), and combinations thereof.

Some examples of a fluorescent dye for converting luminescence of blue light to green light to red light (or from blue light to red light, or green light to red light) may include, but are not limited to: the perylene based dyes such as N,N-bis(2,6-diisopropylphenyl)-1,6,7,12-tetraphenoxyperylene-3,4: 9,10-tetracarboxdiimide (Lumogen Red F300), cyanine-based dyes such as 4-dicyanomethylene-2-methyl-6-(p-dimethylaminostyryl-4H-pyran, pyridine-based dyes such as 1-ethyl-2-(4-(p-dimethylaminophenyl)-1,3-butadienyl)-pyridiniumperchlorate, and rhodamine-based dyes such as Rhodamine Band Rhodamine 6G, and oxazine-based dyes, and combinations thereof.

Some examples of an inorganic fluorescent substances that may be used as part of a color conversion layer may include, but are not limited to: an inorganic fluorescent substance comprising a metal oxide or metal chalcogenide doped with a transition metal ion, including a rare-earth metal ion. In general, any metal-ligand coordination complexes may be used as dyes, and may comprise fluorescent and/or phosphorescent substances.

It may be preferred in some embodiments to utilize a color conversion layer in a configuration where the layer(s) may be stacked (or otherwise disposed) on a color filter. Utilizing a stacked structure of the color conversion layer on the color filter may make be preferred so as to provide for better color purity of the light that is transmitted through the color conversion layer.

As described herein, the material that may be used for the color filter may not be particularly limited, and may comprise any suitable material as would be understood by one of ordinary skill in the art. In some embodiments, the color filter(s) may comprise, for example, a dye, a pigment and a resin, or only a dye or pigment. In some embodiments, where the color filter may comprise a dye, a pigment and a resin, the color filter may be in the form of a solid, where, for instance, the dye and the pigment may be dissolved or dispersed in the binder resin. Some examples of a dye or a pigment that may be used in a color filter include, but are not limited to: perylene, isoindoline, cyanine, azo, oxazine, phthalocyanine, quinacridone, anthraquinone, and diketopyrrolo-pyrrole, and combinations thereof.

In some embodiments, the color conversion layer may comprise a layer formed by mixing the fluorescent medium material contained in a color conversion layer with the color filter material. This may, in some embodiments, provide the color conversion layer with a function of both converting light emitted from light source, as well as performing the function of a color filter by improving color purity. Indeed, in some embodiments, this structure of the color conversion layer and the color filter may be preferred, as the layer structure may be somewhat simplified and may thereby reduce the number of manufacturing steps to fabricate a device.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the fourth sub-pixel may not comprise a color filter and/or a color conversion layer. Although embodiments are not so limited (that is, the white sub-pixel may comprise optical equipment, color conversion layers, color filters, etc.) in general it may be preferred that the white sub-pixel may emit substantially white light that may correspond to the white light emissions of the first light source. As described above, the white balance of the display may be utilized most frequently in displaying images and in forming colors of the pixels. Therefore, assuming that the fourth light emitting device (and in some embodiments, all of the light emitting devices corresponding to each sub-pixel) may be set to the white balance, it may be preferred in some embodiments that the light may be emitted relatively unimpeded from the white sub-pixel. In this manner, embodiments may not need to utilize additional light from the red, green, and blue sub-pixels (or may need to use less light from these sub-pixels)—which may be transmitted through a color filter and thereby increases power consumption—to render colors (including the white balance).

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the chromaticity of the fourth organic light emitting device may be substantially the same as the chromaticity of the light emitted by the fourth sub-pixel. As used herein, "substantially the same" may refer to when the light emissions of the first organic emitting device and the fourth sub-pixel have a duv value on the CIE 1976 Uniform Chromaticity Scale (UCS) diagram that is less than approximately 0.1. As noted above, in some embodiments, the fourth organic light emitting device (and in some embodiments, each of the light emitting devices associated with each sub-pixel) may be set to emit light corresponding to the white balance of the display. Therefore, it may be preferred in some embodiments that the white sub-pixel also emits light having substantially the same chromaticity, so as to increase the efficiency of the device. However, embodiments are not so limited, and the white sub-pixel may emit light having substantially the same chromaticity as the light emitted by the fourth organic light emitting device even in embodiments where the fourth organic light emitting device does not emit light corresponding to the white balance of the display.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the first device may be a display having a white balance. In some embodiments, the white balance may have a first point on the CIE 1976 UCS (L', u', v') color space chromaticity diagram and the fourth sub-pixel may emit light having a second point on the CIE 1976 UCS (L', u', v') color space chromaticity diagram. In some embodiments, the difference between the first point and the second point may have a duv value less than 0.10. As noted above, an RGBW display where the white sub-pixel emits light that has a chromaticity equal to, or close to, the chromaticity of the white balance may operate at high efficiency because the white balance point is the color used most frequently in rendering most colors. Therefore, it may be preferred that such light may be emitted without the light loss that may result from the use of one or more color filters, as may be used when light is contributed from the red, green, and blue sub-pixels. In some embodiments, the difference between the first point and the second point may have a duv value less than 0.05. In some embodiments, the difference between the first point and the second point may have a duv value less than 0.01.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the first, the second, the third, and the fourth organic light emitting device may include exactly two organic emitting materials: a first organic emitting material and a second organic emitting material, where emitting material was defined as above. Note that the emitting material may comprise 95% of emissions to account for a minor level of impurity. For example, the use of two emitting materials for a white OLED may comprise a blue emitting material and a yellow emitting material such that the combined light emission comprises white light. It may be preferred in some embodiments to use two emitting materials rather than three emitting materials because it may reduce the number of fabrication steps that may need to be performed and also may reduce the number of materials needed. However, as noted above, the inventors determined that the use of only two emitting materials may create an inefficient RGBW device using only color filters because of the lack of correspondence between the emissive spectra of the blue and yellow emitting materials to the transmission spectra of the color filters of the green and red sub-pixels. The inventors have discovered that the introduction of one or more color conversion layers in the red and/or green sub-pixels, in accordance with embodiments described above including those shown in FIGS. 12-14, may be used to render such RGBW devices more efficient by reducing power consumption in one or more of the sub-pixels.

In some embodiments, in the first device as described above comprising a first pixel, where the first pixel includes a first sub-pixel having a first organic light emitting device, a first color filter, and a first color conversion layer; a second sub-pixel having a second organic light emitting device, a second color conversion layer, and a second color filter; a third sub-pixel having a third organic light emitting device and a third color filter; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting devices each include exactly two emitting materials: a first organic emitting material and a second organic emitting material, the first organic emitting material may have an emissive spectrum having a peak wavelength between 500 and 630 nm. In some embodiments, in the first device as described above, the second organic emitting material may have an emissive spectrum having a peak wavelength between 400 and 500 nm. That is, as noted above, in some embodiments, the first light source may comprise emitting materials that have emissive spectra corresponding to blue light (e.g. having peak wavelength less than 500 nm) and yellow or green light (e.g. having peak wavelength between 520 and 630 nm).

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device includes exactly two emitting materials: a first organic emitting material and a second organic emitting material, the first organic emitting material may have an emissive spectrum having a peak wavelength between 520 and 630 nm. In some embodiments, in the first device as described above, the second organic emitting material may have an emissive spectrum having a peak wavelength between 400 and 500 nm. That is, as noted above, in some embodiments, the organic light emitting devices may comprise emitting materials that have emissive spectra corresponding to blue light (e.g. having peak wavelength less than 500 nm) and yellow light (e.g. having peak wavelength between 520 and 630 nm). In some embodiments, it may be preferred that the first organic emitting material has an emissive spectrum having a peak wavelength corresponding to yellow light (rather than green light) so as to achieve particular chromaticities of white light. As noted above, the PLQY of the color conversion layer may be a measure of the amount of light that is emitted in comparison to the amount of light that is absorbed. Thus, in some embodiments, the organic light emitting devices may comprise an emitting material that emits blue or yellow/green light, and the color conversion layer(s) may absorb photons having certain wavelengths (corresponding to the absorption spectrum of the color conversion layer) and emit photons at longer wavelengths (e.g. in accordance with its emissive spectrum and likely corresponding to green light or red light). In some embodiments, the first organic emitting material may have a full width at half maximum (FWHM) of less than 100. That is, for instance, in some embodiments, the first emitting material may have a relatively narrow emissive spectrum, which may correspond, for instance to a yellow emitter (which has a relatively small FWHM) in comparison to, for instance, a green emitter that may have a much larger FWHM (which may result in the emission of green light). As noted above, the inventors have found that the use of a yellow emitter may provide better white chromaticities when combined with particular blue emitters. Moreover, the inventors have found that using one or more color conversion layers, the lack of correspondence between the emissive spectrum of a yellow emitting material and the transmission spectrum of the green and/or red spectra may be reconciled in a manner so as to create a more efficient RGBW OLED display (equivalent in power consumption in some embodiments to RGB side-by-side devices).

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device includes a first organic emitting material having an emissive spectrum having a peak wavelength between 520 and 630 nm and a second organic emitting material having an emissive spectrum having a peak wavelength between 400 and 500 nm, the first color conversion layer may have an absorption spectrum such that at least approximately 10% of the light emitted by the first emitting material is absorbed. That is, the first color conversion layer may, for instance, absorb 10% of the light that is emitted from the first emitting material that has a peak wavelength between 520 and 630 nm (e.g. green or yellow light). In some embodiments, the color conversion layer may have an absorption spectrum that corresponds to the emission spectrum of the first emitting material. An example of this is shown in FIG. 7 and described above. The first color conversion layer may be disposed within the red sub-pixel in some embodiments, such that the yellow or green light from the first emitting material may be absorbed, and red light may be reemitted. Moreover, the first color conversion layer may have a PLQY of at least 40%, which in some embodiments may result 40% of the light that is absorbed (e.g. 10% of the total light emitted by the first emitting material in this embodiment) by the first color conversion layer is reemitted at a longer wavelength (unlike, for instance, a color filter, which generally do not reemit 40% the light that is absorbed).

In general, the greater the overlap between the emissive spectrum of the emitting material and the absorption spectrum of the color conversion layer, the greater the potential efficacy of the device because more light having a wavelength that may otherwise be blocked by a color filter in a sub-pixel may be converted to longer wavelengths (however, other factors may also affect the efficiency of the device, such as the emission spectrum of the color conversion layer). Thus, in some embodiments, the first color conversion layer may have an absorption spectrum such that at least approximately 30% of the light emitted by the first emitting material is absorbed. In some embodiments, the first color conversion layer may have an absorption spectrum such that at least approximately 50% of the light emitted by the first emitting material is absorbed As noted above, the greater the amount of the light that is absorbed, the higher the potential efficiency of the device. In some embodiments, a first color conversion layer may have an absorption spectrum such that at least approximately 10% of the light emitted by the second emitting material is absorbed. That is, the first color conversion layer may have an absorption spectrum such that light that is emitted from both the first and the second emitting materials may be absorbed and then reemitted at longer wavelengths. Such color conversion layers may be preferred because they may provide increased efficiency for the device based on the ability to utilize the additional light that is emitted by the organic lighting devices (corresponding to light having a peak wavelength between 400 and 500 nm) to generate (e.g. reemit) light that may then be transmitted through a corresponding sub-pixel.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first color conversion layer and/or the second conversion layer may have a photoluminescence quantum yield (PLQY) of at least 40%, and where the first organic light emitting device includes a first organic emitting material having an emissive spectrum having a peak wavelength between 520 and 630 nm and a second organic emitting material having an emissive spectrum having a peak wavelength between 400 and 500 nm, the first color conversion layer may have an absorption spectrum such that at least approximately 10% of the light emitted by the first organic light emitting device is absorbed. That is, of the total light emitted by the first light source (e.g. the light emitted by the first emitting material and the second emitting material), the first color conversion layer may, in some embodiments, absorb at least 10% of the light emitted. The first color conversion layer may absorb light from one or both of the emitting materials. In general, as noted above, the more light that may be absorbed, the more light that may then be reemitted by the color conversion layer at longer wavelengths within the sub-pixels.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device includes a first organic emitting material having an emissive spectrum having a peak wavelength between 520 and 630 nm and a second organic emitting material having an emissive spectrum having a peak wavelength between 400 and 500 nm, the second color conversion layer may have an absorption spectrum such that at least approximately 10% of the light emitted by the second emitting material is absorbed. That is, for instance, the second emitting material may be disposed in the green sub-pixel, and may absorb the light that is emitted by the blue emitting material and reemit the light at a longer wavelength corresponding to green light. In this manner, in some embodiments, the green sub-pixel may also be optimized (or at least have its power consumption reduced). In some embodiments, the second color conversion layer may have an absorption spectrum such that at least approximately 30% of the light emitted by the second emitting material is absorbed. As noted above, in general the higher the absorption rate of the light by a color conversion layer, the greater the potential to convert light having shorter wavelengths to light having longer wavelengths that may then be transmitted by the color filter of a sub-pixel (e.g. the green sub-pixel in this case). Exemplary embodiments comprising a first and a second color conversion layer were described above wither reference to FIG. 13.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first color conversion layer and/or the second conversion layer may have a photoluminescence quantum yield (PLQY) of at least 40%, and where the first, the second, the third, and the fourth organic light emitting device includes a first organic emitting material having an emissive spectrum having a peak wavelength between 520 and 630 nm and a second organic emitting material having an emissive spectrum having a peak wavelength between 400 and 500 nm, the second color conversion layer may have an absorption spectrum such that at least approximately 5% of the light emitted by the second organic light emitting device is absorbed. Similar to the embodiment comprising the first color conversion layer described above (which may be located in the red sub-pixel), the second color conversion layer (which may be located in the green sub-pixel) may also absorb a substantial amount of light from the entire second organic light emitting device. However, unlike the first color conversion layer in some embodiments, the second color conversion may in some embodiments be limited in total amount of light that may be absorbed and reemitted—particularly with regard to light emitted by the first emitting material (such as yellow or green light). That is, for instance, because the light emitted by the first emitting material may already have longer wavelengths then may be transmitted by the green color filter, it may not be efficient for the second color conversion to reemit light at a longer wavelength than could be transmitted by the green sub-pixel. Thus, in some embodiments, there may be no reason to have an absorption spectrum that comprises the longer wavelengths of light.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, and where the first, the second, the third, and the fourth organic light emitting device includes a exactly two emitting materials: a first organic emitting material and a second organic emitting material, the first organic emitting material may have an emission spectrum such that it emits yellow light that has a first point on the CIE 1931 XYZ color space chromaticity diagram within a first area defined by $CIE_X$=0.40 to 0.600, $CIE_Y$=0.400 to 0.60. The second organic emitting material may have an emissive spectrum such that it emits blue light that has a second point on the CIE 1931 XYZ color space chromaticity diagram within a second area defined by $CIE_X$=0.100 to 0.200, $CIE_Y$=0.050 to 0.300. The first point and the second point may be such that when a line is drawn between the first point and the second point, the line passes through a desired white point on the CIE 1931 XYZ color space chromaticity diagram within an area defined to be $CIE_X$=0.25 to 0.4, $CIE_Y$=0.25 to 0.4. In some embodiments, the concentration of the first and second organic emitting materials may be such that the light produced by the first, the second, the third, and the fourth organic light emitting device is at a third point on the CIE 1931 XYZ color space chromaticity diagram that is within the desired white area. That is, as noted above, in some embodiments, the organic light emitting devices may comprise two emitting materials that emit yellow and blue light. As noted above, the inventors have found that by utilizing a yellow emitting material (which does not significantly have an emissive spectrum that corresponds to the transmittance spectrum of green or red color filters) in combination with one or more color conversion layers, an RGBW display comprising two emitters may be provided that comprises a comparable power consumption profile with similar devices.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, and where the first, the second, the third, and the fourth organic light emitting devices include exactly two emitting materials: a first organic emitting material and a second organic emitting material, the first and/or the second organic emitting material may comprise a phosphorescent emitter. In some embodiments, the first organic emitting material may comprise a phosphorescent emitter and the second organic emitting material may comprise a fluorescent emitter. In general, the emitting materials may comprise any suitable material. However, the use of phosphorescent materials in some embodiments may have longer lifetimes and/or cooler operating temperatures at a given luminance. Therefore, based on the intended application that the device will be used for, the appropriate material for the emitters may be chosen.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the fourth sub-pixel may emit light that has a first point on the CIE 1931 XYZ color space chromaticity diagram within a first area defined by $CIE_X$=0.25 to 0.4, $CIE_Y$=0.25 to 0.4. That is, for instance, the fourth sub-pixel may emit white light that may be defined using the CIE 1931 XYZ color space chromaticity diagram. As was previously described, in general most of the colors generated by a display may comprise a large proportion of white light (which is determined by the white balance of the display), and thereby by matching (or nearly matching) the light emissions from the white sub-pixel to the white balance of the display, embodiments may increase the efficiency of the device by not having to further utilize the light from the red, green, and blue sub-pixels that must then be passed through a color filter (and thereby may create losses) to emit white light from a pixel of the display.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the fourth sub-pixel may emit light that has a first point on the CIE 1976 UCS (L', u', v') color space chromaticity diagram that lies within a Duv distance of 0.010 from the Planckian locus. In general, it may be preferred that the white sub-pixel emit light that is as near to white light as possible, as most displays white balance may also correspond to a point on the Planckian locus (or very near such a point). Whether the white balance corresponds to D65, D90, or some other white point, the closer the light emissions from the white sub-pixel are to the white balance of the display, generally the more efficient the OLED display may become. In this regard, in some embodiments, the fourth sub-pixel may emit light that has a first point on the CIE 1976 UCS (L', u', v') color space chromaticity diagram that lies within a Duv distance of 0.005 from the Planckian locus. In some embodiments, the fourth sub-pixel may emit light that has a first point on the CIE 1976 UCS (L', u', v') color space chromaticity diagram that lies within a Duv distance of 0.002 from the Planckian locus. Some embodiments may also account for slight impurities in the organic light emitting devices (for instance, if the light source contains manufacturing defects or subsequent degradation that causes the device to no longer emit white light having a designated chromaticity) and/or any optical components that may be present in the white sub-pixel that could alter the chromaticity of the light.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the fourth sub-pixel may emit light that has a correlated color temperature (CCT) that is greater than 4000 K and less than 10000 K. This may comprise embodiments where the white pixel may be color tunable along the Planckian locus and/or may have a chromaticity comprising cooler or warmer white light. The chromaticity of the light emitted by the white sub-pixel may be predicated, in part, on the white balance of the display and/or the light emissions from the first light source. In some embodiments, in the first device as described above, the first, the second, the third, and the fourth organic light emitting device are each a stacked organic light emitting device (SOLED). A stacked OLED design may be preferred because it may enable the light emitted from multiple emitting materials to more readily be combined to, for instance, create white light. However, embodiments are not so limited, and any suitable OLED may be used for the first light source, including, by way of example only, top-emitting OLEDs, bottom emitting OLEDs, transparent OLED (TOLEDs), etc.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first, the second, the third, and the fourth organic light emitting devices may each include three organic emitting materials: a first organic emitting material, a second organic emitting material, and a third organic emitting material. That is, although it may be preferred in some embodiments (as described above) to use only two emitting materials to reduce costs and/or manufacturing time, embodiments are not so limited. Indeed, embodiments may comprise any number of emitting materials, arranged in any suitable manner, and comprising any suitable material, as would be understood by a person of ordinary skill in the art after reading this disclosure.

In some embodiments, the first organic emitting material may have an emission spectrum such that it emits red light that has a first point on the CIE 1931 XYZ color space chromaticity diagram within a first area defined by $CIE_X$=0.600 to 0.720, $CIE_Y$=0.280 to 0.400. In some embodiments, the second organic emitting material may have an emission spectrum such that it emits green light that has a second point on the CIE 1931 XYZ color space chromaticity diagram within a second area defined by $CIE_X$=0.200 to 0.400, $CIE_Y$=0.600 to 0.750. In some embodiments, the third organic emitting material may have an emission spectrum such that it emits blue light that has a third point on the CIE 1931 XYZ color space chromaticity diagram within a third area defined by $CIE_X$=0.100 to 0.200, $CIE_Y$=0.050 to 0.300. That is, the organic light emitting devices may comprise a red emitting material, a blue emitting material, and a green emitting material. As previously described, the inventors have found that the use of color conversion layers may be particularly beneficial for use with yellow emitters because of the reduction in costs and/or manufacturing time. However, the inventors have also found that devices comprising three emitting materials (e.g. red, green, and blue emitting materials), despite having an emitting material that has an emissive spectrum that may correspond to the transmittance spectrum of each of the color filters, may still provide for more efficient devices. One of the reasons may be that down converting from the blue and/or green emitting materials to red emission is additive to the red emission corresponding to the red emitting material; the light emissions corresponding to the blue emitting material and the green emitting material may still be (at least partially) blocked by the red color filters, and similarly the light emissions corresponding to the blue emitting material may be (at least partially) blocked by the green color filter (although the light corresponding to the red emitting material may also be blocked by the green color filter, the red emissions are most likely longer wavelengths, and therefore down converting these wavelengths would likely not increase emissions from the green sub pixel). Therefore, similar to the above embodiments, one or more sub-pixels may comprise a color conversion layer(s) so as to increase the transmittance of light through one or both of the red and green color filters.

In some embodiments, in the first device as described, the first, second, and third point in the embodiment above may be such that a fourth area may be defined by a line that is drawn between the first point and the second point, the second point and the third point, and the third point and the first point and that includes a desired white point on the CIE 1931 XYZ color space chromaticity diagram within an area defined to be $CIE_x$=0.25 to 0.40, $CIE_y$=0.25 to 0.40. In some embodiments, a concentration of the first, second, and third organic emitting materials may be such that the light that may be produced by the first organic light emitting device may be at a fourth point on the CIE 1931 XYZ color space chromaticity diagram that is within the desired white area. That is, for instance, the combined emissions of the first, second, and third emitting materials may comprise white light (including, for example D65, D90 etc.). Moreover, the use of three emitting materials in some embodiments (e.g. corresponding to RGB) rather than only two emitting materials may provide for increased flexibility in setting and/or changing the white point of the device.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first, the second, the third, and the fourth organic light emitting devices each may include three organic emitting materials: a first organic emitting material, a second organic emitting material, and a third organic emitting material, the first, second, and/or third organic emitting materials comprise phosphorescent emitters. In some embodiments, the third organic emitting material may comprise fluorescent emitters and the first and second organic emitting materials may comprise phosphorescent emitters. However, as noted above, the emitting materials may comprise any suitable material, depending on the application and intended use of the device, as well as cost and manufacturing considerations. For instance, while in general phosphorescent emitters may have higher luminance at lower operating temperatures, such materials may also increase the costs of manufacturing.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first, the second, the third, and the fourth organic light emitting devices may each include three organic emitting materials: a first organic emitting material, a second organic emitting material, and a third organic emitting material, the first organic emitting material may have an emission spectrum having a peak wavelength between 580 and 700 nm (e.g. red light), the second organic emitting material may have an emission spectrum having a peak wavelength between 500 and 580 nm (e.g. green light), and the third organic emitting material may have an emission spectrum having a peak wavelength between 400 and 500 nm (e.g. blue light).

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, where the first, the second, the third, and the fourth organic light emitting devices each may include three organic emitting materials: a first organic emitting material having an emission spectrum having a peak wavelength between 580 and 700 nm, a second organic emitting material having an emission spectrum having a peak wavelength between 500 and 580 nm, and a third organic emitting material having an emission spectrum having a peak wavelength between 400 and 500 nm, the first color conversion layer may have an absorption spectrum such that at least approximately 20% of the light emitted by the second and third emitting materials may be absorbed. That is, the absorption spectrum of the first color conversion layer may be broad enough to cover some (or all) of the light emissions of one or more of the emitting materials. As noted above, color conversion layers that have wide absorption areas may be preferred because of the potential to increase efficiency by absorbing additional light that otherwise may be blocked by a corresponding color filter of one of the sub-pixels. In the exemplary embodiment described above, the first color conversion layer may have an absorption spectrum such that both blue light and green light may be absorbed and reemitted at a longer wavelength so that the red color filter may transmit the light (i.e. the reemitted light has wavelengths corresponding to the transmittance spectrum of the red color filter). This may thereby increase the efficiency of the red sub-pixel in some embodiments. Moreover, the inventors have found that a color conversion layer that absorbs at least 20% of the light emitted by the blue and green emitting materials and reemits a reasonable amount of the light that is absorbed (e.g. the PLQY of the color conversion layer is at least approximately 40%) can increase the efficiency of the red sub-pixel by a reasonable amount. However, it may be preferred that the red sub-pixel have an even greater increase in efficiency, such that in some embodiments, in the first device as described above, the first color conversion layer may have an absorption spectrum such that at least approximately 40% of the light emitted by the second and third emitting materials is absorbed. In some embodiments, in the first device as described above, the first color conversion layer may have an absorption spectrum such that at least approximately 10% of the light emitted by the second emitting material and/or the third emitting material is absorbed.

In some embodiments, in the first device as described above, the first color conversion layer may have an absorption spectrum such that at least approximately 10% of the light emitted by the first organic light emitting device is absorbed. That is, in some embodiments, the first color conversion layer may absorb 10% of all of the light that is emitted by the first organic light emitting device (e.g. the light emitted from the first, the second, and the third emitting materials).

In some embodiments, in the first device as described above, the second color conversion layer may have an absorption spectrum such that at least approximately 10% of the light emitted by the third emitting material is absorbed. That is, for instance, the second color conversion layer, which may be disposed in the green sub-pixel, may absorb light that is emitted from the blue emitting material (e.g. having a shorter wavelength) and reemit that light at a longer wavelength corresponding to green light (and potentially corresponding to the transmittance spectrum of the green color filter). In some embodiments, in the first device as described above, the second color conversion layer has an absorption spectrum such that at least approximately 30% of the light emitted by the third emitting material is absorbed.

In some embodiments, in the first device as described above, the second color conversion layer may have an absorption spectrum such that at least approximately 5% of the light emitted by the second organic light emitting device is absorbed. The percentage of light that is absorbed by the second color conversion lay may in general be less than that of the first color conversion layer in some embodiments because the second color conversion may only absorb light emitted from the blue light emitting material, whereas the first color conversion layer may absorb and reemit light corresponding to both the blue and the green emitting materials.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, each of the first, second, third, and fourth sub-pixels may have an aperture size, and the aperture size of the fourth sub-pixel may be larger than the aperture size of each of the first, second, and third sub-pixels. As was noted above, the white sub-pixel (that may emit light that corresponds to the white balance of the display) may be the most frequently used sub-pixel. By utilizing a larger aperture, the first light source may be operated at lower current density and still provide the same brightness for the device, because, the decrease caused by the lower current or voltage that drives the device, may be offset by the larger area emitting white light by the fourth sub-pixel.

In some embodiments, in the first device as described above comprising a first pixel, where the first pixel includes a first sub-pixel having a first color filter, a first organic light emitting device, and a first color conversion layer; a second sub-pixel having a second color filter, a second organic light emitting device, and a second color conversion layer; a third sub-pixel having a third color filter and a third organic light emitting device; and a fourth sub-pixel having a fourth organic light emitting device and emits near white light, the first sub-pixel may further include a third color conversion layer, where the third color conversion layer may be in optical communication with the first organic light emitting device and may be disposed between the first organic light emitting device and the first color filter. In some embodiments, the third color conversion layer may include a material having an absorption spectrum having a peak wavelength that is less than 500 nm and an emission spectrum having a peak wavelength between 500 and 580 nm. In some embodiments, the third color conversion layer may be disposed between the first organic light emitting device and the first color conversion layer. That is, for instance, in some embodiments the red sub-pixel may include two color conversion layers. The first color conversion layer may have an absorption spectrum so as to absorb light having a peak wavelength between 500 and 580 (e.g. green light) and an emission spectrum with peak a wavelength between 580 and 700 nm (e.g. red light); and the third color conversion layer may have an absorption spectrum so as to absorb light having a peak between 400 and 500 nm (e.g. blue light) and an emission spectrum with a peak wavelength between 500 and 580 nm (e.g. green light). In some embodiments, the light that is reemitted by the first color conversion layer (or a portion thereof) may be absorbed by the third color conversion layer, which may then reemit the light again so as to have a wavelength corresponding to the wavelength of the transmittance spectrum of the color filter of the sub-pixel. In this way, embodiments may provide for reduced power consumption by using more of the emissive spectrum of the light emitted by the first light source in at least the red sub-pixel. An exemplary embodiment is illustrated in FIG. 14 and described above.

In some embodiments, in the first device as described above comprising a first pixel, where the first pixel includes a first sub-pixel having a first color filter and a first organic light emitting device; a second sub-pixel having a second color filter and a second organic light emitting device; a third sub-pixel having a third color filter and a third organic light emitting device; and a fourth sub-pixel having a fourth organic light emitting device and emits near white light, the first sub-pixel may include a first color conversion layer. The first color conversion layer may be in optical communication with the first organic light emitting device and may be disposed between the first organic light emitting device and the first color filter. In some embodiments, the first color conversion layer may comprise a material having an absorption spectrum having a peak wavelength that is less than 600 nm and an emission spectrum with a peak wavelength between 580 and 700 nm. That is, in some embodiments, the red sub-pixel may have a color conversion layer, but the green sub-pixel may not have a color conversion layer. An example of this embodiment was shown in FIG. 12, and described above.

In some embodiments, in the first device as described above comprising a first pixel, where the first pixel includes a first sub-pixel having a first color filter and a first organic light emitting device; a second sub-pixel having a second color filter and a second organic light emitting device; a third sub-pixel having a third color filter and a third organic light emitting device; and a fourth sub-pixel having a fourth organic light emitting device and emits near white light, the second sub-pixel may include a color conversion layer. The color conversion layer may be in optical communication with the second organic light emitting device and may be disposed between the second organic light emitting device and the second color filter. The second color conversion layer may comprise a material having an absorption spectrum having a peak wavelength that is less than 500 nm and an emission spectrum with a peak wavelength between 500 and 580 nm. That is, in some embodiments (unlike the embodiment described above) the green sub-pixel may have a color conversion layer, but the red sub-pixel may not have a color conversion layer.

Figure 15A:
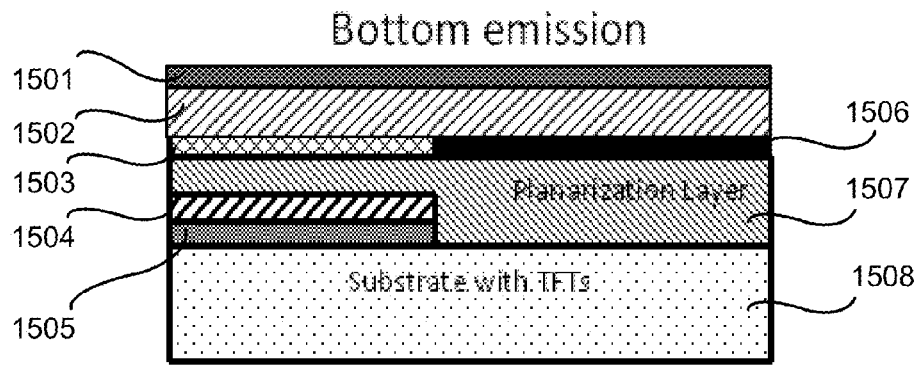
FIG. 15(a) shows exemplary sub-pixels of a bottom emission RGBW OLED display comprising a color conversion layer in accordance with some embodiments.
Figure 15B:
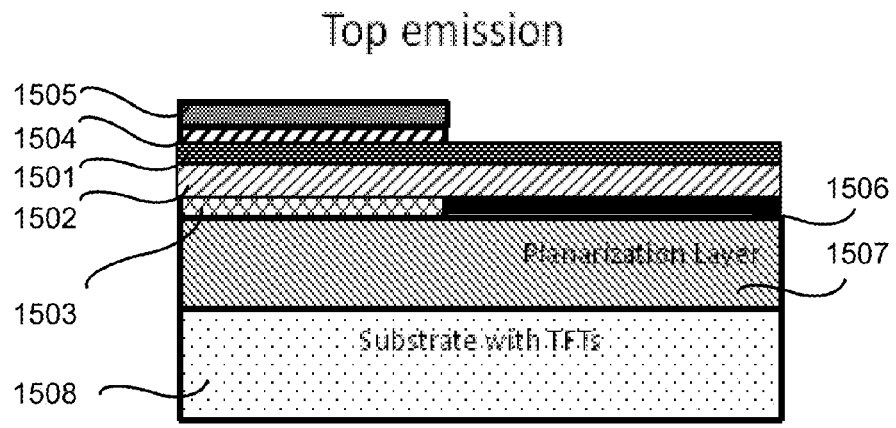
FIG. 15(b) shows exemplary sub-pixels of a top emission RGBW OLED display comprising a color conversion layer in accordance with some embodiments.
Figure 15C:
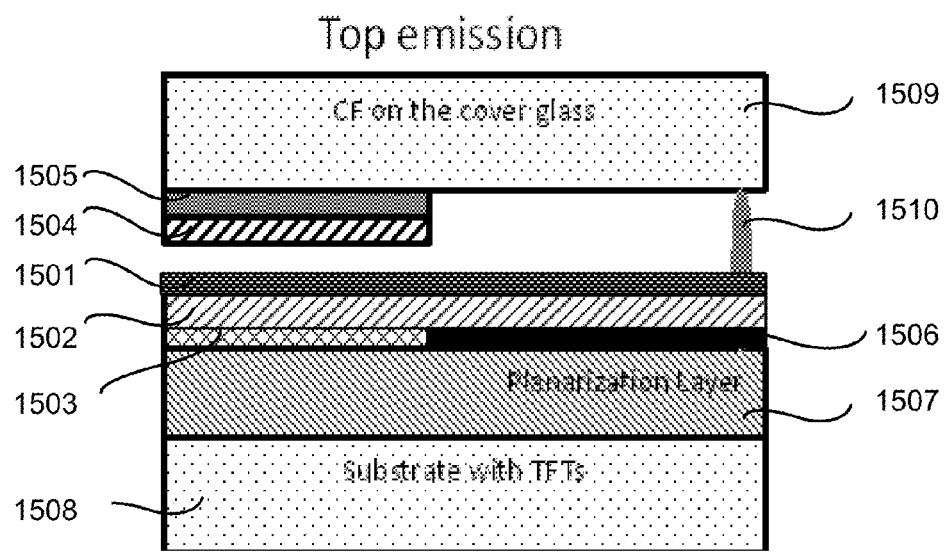
FIG. 15(c) shows exemplary sub-pixels of a top emission RGBW OLED display comprising a color conversion layer and a spacer in accordance with some embodiments.

With reference to FIGS. 15(a)-(c), three additional exemplary embodiments are shown that further illustrate configurations for which the pixel (or pixels) of a device may be arranged. It should again be noted that this is provided for illustration purposes only. However, the concepts and features described herein may be combined with one or more of the aspects discussed above, as may be understood by one of ordinary skill in the art after reading this disclosure. It should be noted that for simplicity of illustration, each of FIGS. 15(a)-(c) depict only two sub-pixels of a pixel.

As shown in each of FIGS. 15(a)-(c), the exemplary devices shown each comprise: a common electrode 1501; a common organic layer (which may comprise a plurality of emitting materials); a patterned electrode 1503 corresponding to a first organic light emitting device for a first sub-pixel; a second patterned electrode 1506 corresponding to a second organic light emitting device for a second sub-pixel; a color conversion layer 1504 disposed within the first sub-pixel; a color filter 1505 disposed with the first sub-pixel; a planarization layer 1507; and a substrate 1508 that may comprise one or more thin film transistors (TFTs). As shown, these exemplary embodiment may comprise, for instance a red or green sub-pixel (having color conversion layer 1504) and a white sub-pixel (corresponding to patterned image layer 1506, and which is not shown as comprising a color filter or color conversion layer). In general, the TFTs may control whether and how much current or voltage is supplied to each of the organic light emitting devices associated with each pixel. That is, in some embodiments, there may be one or more interconnect vias from the substrate comprising the TFTs to the patterned electrodes. The planarization layer 1507 may be used in order to provide a smooth and featureless interface for depositing the organic and/or any other layers of the device.

FIG. 15(*a*) discloses an exemplary embodiment of a bottom emission device. That is, the light that is generated will be transmitted through each sub-pixel and be emitted through the substrate 1508. Photons may be generated in the common organic layer 1502, and may be transmitted through the planarization layer 1507 (which should be transparent) and color conversion layer 1504, where the photons having shorter wavelengths may be down converted to photons having longer wavelengths. The photons may then pass through (or be blocked by) color filter 1505 before being emitted through the substrate 1508. In this embodiment, the pattered electrodes 1503 and 1506 may be transparent or semi-transparent.

FIG. 15(*b*) is an exemplary embodiment of a top emission device. That is, the light that is generated will be transmitted through each sub-pixel and be emitted in the direction away from the substrate 1508. Photons may be generated in the common organic layer 1502, and may be transmitted through color conversion layer 1504, where the photons having shorter wavelengths may be down converted to photons having longer wavelengths. The photons may then pass through (or be blocked by) color filter 1505 before being emitted from the sub-pixel. In this embodiment, the common electrode 1501 may be transparent or semi-transparent.

FIG. 15(*c*) shows another exemplary embodiment of a top emission device. In this exemplary embodiment, a spacer 1510 is provided between the organic light emitting devices and the color filter 1505 and color conversion layer 1504 (which are shown as being coupled to a cover glass 1509 of a display). This exemplary embodiment may provide the advantage that the organic light emitting devices and the color conversion layers and color filter may be fabricated separately on separate substrates. The organic layers are often susceptible to damage, so coupling the color filter and color conversion layer to a separate substrate (in this case the cover glass 1509) rather than depositing these layers directly over the organic devices may protect the organic layers and reduce damage during the manufacturing process. However, the cover glass may have to be properly aligned so that the color filters and color conversion layers correspond to the underlying sub-pixel architecture. As shown, the light that is generated will be transmitted through each sub-pixel and be emitted in the direction away from the substrate 1508. Photons may be generated in the common organic layer 1502, and may be transmitted through the space maintained by the spacer 1510 and the color conversion layer 1504, where the photons having shorter wavelengths may be down converted to photons having longer wavelengths. The photons may then pass through (or be blocked by) color filter 1505 before being emitted through the cover glass 1509. In this embodiment, the patterned electrodes 1503 and 1506 may be reflective or semi-transparent, and the electrode 1501 (which may, for instance comprise a common cathode) may be transparent or semi-transparent.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

A recitation of "a", "an" or "the" is intended to mean "one or more" unless specifically indicated to the contrary.

What is claimed is:

1. A first device comprising:
at least one pixel, wherein the pixel comprises a first sub-pixel, a second subpixel, a third sub-pixel, and a fourth sub-pixel, wherein:
  the first sub-pixel comprises:
    a first organic light emitting device;
    a first color filter in optical communication with the first organic light emitting device, wherein the first color filter is adapted to preferentially pass light from the first organic light emitting device having a peak wavelength in the visible spectrum between 580 and 700 nm; and
    a first color conversion layer, wherein:
      the first color conversion layer is in optical communication with the first organic light emitting device and is disposed between the first organic light emitting device and the first color filter; and
      the first color conversion layer comprises a material having an absorption spectrum having a peak wavelength that is less than 600 nm and an emission spectrum having a peak wavelength that is between 580 and 700 nm;
  the second sub-pixel comprises:
    a second organic light emitting device;
    a second color filter in optical communication with the second organic light emitting device, wherein the second color filter is adapted to preferentially pass light from the second organic light emitting device having a peak wavelength in the visible spectrum between 500 and 580 nm; and
    a second color conversion layer, wherein:
      the second color conversion layer is in optical communication with the second organic light emitting device and is disposed between the second organic light emitting device and the second color filter; and
      the second color conversion layer comprises a material having an absorption spectrum having a peak wavelength that is less than 500 nm and an emission spectrum having a peak wavelength that is between 500 and 580 nm;
  the third sub-pixel comprises:
    a third organic light emitting device; and
    a third color filter in optical communication with the third organic light emitting device, wherein the third color filter is adapted to preferentially pass light from the third organic light emitting device having a peak wavelength in the visible spectrum between 400 and 500 nm;
  the fourth sub-pixel comprises a fourth organic light emitting device and emits near white light having a point on the CIE 1976 UCS (L', u', v') color space chromaticity diagram that lies within a duv distance of 0.010 from the Planckian locus,
wherein the first, the second, the third, and the fourth organic light emitting device each comprise exactly two organic emitting materials, a first organic emitting material and a second organic emitting material;

wherein the first organic emitting material has an emissive spectrum having a peak wavelength between 500 and 630 nm;

wherein the second organic emitting material has an emissive spectrum having a peak wavelength between 400 and 500 nm; and wherein the first color conversion layer and the second conversion layer have a photoluminescence quantum yield (PLQY) of at least 40%.

2. The first device of claim 1, wherein the chromaticity of the fourth organic light emitting device is substantially the same as the chromaticity of the light emitted by the fourth sub-pixel.

3. The first device of claim 1,
wherein the first device is a display having a white balance;
wherein the white balance has a first point on the CIE 1976 UCS (L', u', v') color space chromaticity diagram;
wherein the fourth sub-pixel emits light having a second point on the CIE 1976 UCS (L', u', v') color space chromaticity diagram; and
wherein the difference between the first point and the second point has a duv value less than 0.10.

4. The first device of claim 1,
wherein the first organic emitting material has an emissive spectrum having a peak wavelength between 520 and 630 nm;
wherein the second organic emitting material has an emissive spectrum having a peak wavelength between 400 and 500 nm.

5. The first device of claim 4, wherein the first organic emitting material has an emissive spectrum having a full width at half maximum (FWHM) of less than 100 nm.

6. The first device of claim 4, wherein the first color conversion layer has an absorption spectrum such that at least approximately 10% of the light emitted by the first emitting material is absorbed.

7. The first device of claim 4, wherein the first color conversion layer has an absorption spectrum such that at least approximately 30% of the light emitted by the first emitting material is absorbed.

8. The first device of claim 4, wherein the second color conversion layer has an absorption spectrum such that at least approximately 10% of the light emitted by the second emitting material is absorbed.

9. The first device of claim 8, wherein the second color conversion layer has an absorption spectrum such that at least approximately 30% of the light emitted by the second emitting material is absorbed.

10. The first device of claim 1,
wherein the first organic emitting material has an emission spectrum such that it emits yellow light that has a first point on the CIE 1931 XYZ color space chromaticity diagram within a first area defined by $CIE_x$=0.400 to 0.600, $CIE_y$=0.400 to 0.600;
wherein the second organic emitting material has an emission spectrum such that it emits blue light that has a second point on the CIE 1931 XYZ color space chromaticity diagram within a second area defined by $CIE_x$=0.100 to 0.200, $CIE_y$=0.050 to 0.300, such that when a line is drawn between the first point and the second point, it passes through a desired white area defined on the CIE 1931 XYZ color space chromaticity diagram to be within $CIE_x$=0.25 to 0.4, $CIE_y$=0.25 to 0.4; and
wherein a concentration of the first and second organic emitting materials is such that the light produced by the first, the second, the third, and the fourth organic light emitting devices is at a third point on the CIE 1931 XYZ color space chromaticity diagram that is within the desired white area.

11. The first device of claim 1, wherein:
the first sub-pixel further comprises a third color conversion layer, wherein:
the third color conversion layer is in optical communication with the first organic light emitting device and is disposed between the first organic light emitting device and the first color filter; and
the third color conversion layer comprises a material having an absorption spectrum having a peak wavelength that is less than 500 nm and an emission spectrum having a peak wavelength between 500 and 580 nm.

12. A first device comprising:
at least one pixel, wherein the pixel comprises a first sub-pixel, a second subpixel, a third sub-pixel, and a fourth sub-pixel, wherein:
the first sub-pixel comprises:
a first organic light emitting device; and
a first color filter in optical communication with the first organic light emitting device, wherein the first color filter is adapted to preferentially pass light from the first organic light emitting device having a peak wavelength in the visible spectrum between 580 and 700 nm; the first sub-pixel comprises a first color conversion layer, wherein:
the first color conversion layer is in optical communication with the first organic light emitting device and is disposed between the first organic light emitting device and the first color filter: and
the first color conversion layer comprises a material having an absorption spectrum having a peak wavelength that is less than 600 nm and an emission spectrum having a peak wavelength that is between 580 and 700 nm;
the second sub-pixel comprises:
a second organic light emitting device; and
a second color filter in optical communication with the second organic light emitting device, wherein the second color filter is adapted to preferentially pass light from the second organic light emitting device having a peak wavelength in the visible spectrum between 500 and 580 nm;
a second color conversion layer, wherein:
the second color conversion layer is in optical communication with the second organic light emitting device and is disposed between the second organic light emitting device and the second color filter; and
the second color conversion layer comprises a material having an absorption spectrum having a peak wavelength that is less than 500 nm and an emission spectrum having a peak wavelength that is between 500 and 580 nm
the third sub-pixel comprises:
a third organic light emitting device; and
a third color filter in optical communication with the third organic light emitting device, wherein the third color filter is adapted to preferentially pass light from the first organic light emitting device having a peak wavelength in the visible spectrum between 400 and 500 nm;
the fourth sub-pixel comprises a fourth organic light emitting device and emits near white light having a point on the CIE 1976 UCS (L', u', v') color space chromaticity diagram that lies within a duv distance of 0.010 from the Planckian locus, wherein the first, the second, the third, and the fourth organic light emitting devices each comprise exactly two organic emitting materials, a first organic emitting material and a second organic emitting material;

wherein the first organic emitting material has an emission spectrum such that it emits yellow light that has a first point on the CIE 1931 XYZ color space chromaticity diagram within a first area defined by $CIE_x$=0.400 to 0.600, $CIE_y$=0.400 to 0.600;

wherein the second organic emitting material has an emission spectrum such that it emits blue light that has a second point on the CIE 1931 XYZ color space chromaticity diagram within a second area defined by $CIE_x$=0.100 to 0.200, $CIE_y$=0.050 to 0.300, such that when a line is drawn between the first point and the second point, it passes through a desired white area defined on the CIE 1931 XYZ color space chromaticity diagram to be within $CIE_x$=0.25 to 0.4, $CIE_y$=0.25 to 0.4; and wherein a concentration of the first and second organic emitting materials is such that the light produced by the first, the second, the third, and the fourth organic light emitting devices is at a third point on the CIE 1931 XYZ color space chromaticity diagram that is within the desired white area.

\* \* \* \* \*